(12) United States Patent
Kim et al.

(10) Patent No.: US 11,626,143 B2
(45) Date of Patent: Apr. 11, 2023

(54) OUTPUT DRIVER AND SEMICONDUCTOR MEMORY DEVICE HAVING THE SAME

(71) Applicants: SAMSUNG ELECTRONICS CO., LTD., Suwon-si (KR); RESEARCH & BUSINESS FOUNDATION SUNGKYUNKWAN UNIVERSITY, Suwon-si (KR)

(72) Inventors: Hyeran Kim, Uiwang-si (KR); Junyeol Lee, Hwaseong-si (KR); Jung-Hoon Chun, Suwon-si (KR)

(73) Assignees: SAMSUNG ELECTRONICS CO., LTD., Suwon-si (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 21 days.

(21) Appl. No.: 17/481,995

(22) Filed: Sep. 22, 2021

(65) Prior Publication Data

US 2022/0254383 A1 Aug. 11, 2022

(30) Foreign Application Priority Data

Feb. 5, 2021 (KR) .......................... 10-2021-0016550

(51) Int. Cl.
*G11C 5/14* (2006.01)
*G11C 8/10* (2006.01)
(52) U.S. Cl.
CPC ................ *G11C 5/145* (2013.01); *G11C 8/10* (2013.01)

(58) Field of Classification Search
CPC ........ G11C 5/145; G11C 11/4096; G11C 7/10
USPC ..................................................... 365/230.06
See application file for complete search history.

(56) References Cited

U.S. PATENT DOCUMENTS

| | | |
|---|---|---|
| 7,243,176 B2 | 7/2007 | To et al. |
| 8,599,914 B1 | 12/2013 | Eliaz |
| 8,605,397 B2 | 12/2013 | Poulton et al. |
| 8,611,437 B2 | 12/2013 | Poulton et al. |

(Continued)

OTHER PUBLICATIONS

Jun-Yeol Lee et al., "A Dual-Mode Ground-Referenced Signaling Transceiver with a 3-Tap Feed-Forward Equalizer for Memory Interfaces", IEEE Asian Solid-State Circuits Conference, Nov. 9-11, 2020.

(Continued)

*Primary Examiner* — Anthan Tran
(74) *Attorney, Agent, or Firm* — F. Chau & Associates, LLC

(57) ABSTRACT

An output driver includes a pre driver including pre driving circuits, each including first and second pre pumps, and a main driver including main driving circuits, each including first and second main pumps. Each of the first and second pre pumps includes a first driving capacitor, and each of the first and second main pumps includes a second driving capacitor. During a first half cycle of a clock signal, the first pre pump and the first main pump perform a precharge operation, and the second pre pump and the second main pump perform a first driving operation, and during a second half cycle of the clock signal, the first pre pump and the first main pump perform the first driving operation, and the second pre pump and the second main pump perform the precharge operation. Capacitances of the first and second driving capacitors are different.

20 Claims, 14 Drawing Sheets

(56) References Cited

U.S. PATENT DOCUMENTS

| | | | |
|---|---|---|---|
| 8,854,123 | B1 | 10/2014 | Dally et al. |
| 8,867,595 | B1 | 10/2014 | Luo et al. |
| 8,942,297 | B2 | 1/2015 | Best et al. |
| 9,071,244 | B2 | 6/2015 | Poulton et al. |
| 9,076,551 | B2 | 7/2015 | Dally et al. |
| 9,147,447 | B2 | 9/2015 | Dally et al. |
| 9,153,314 | B2 | 10/2015 | Dally |
| 9,153,539 | B2 | 10/2015 | Dally et al. |
| 9,170,980 | B2 | 10/2015 | Dally et al. |
| 9,171,607 | B2 | 10/2015 | Dally et al. |
| 9,251,870 | B2 | 2/2016 | Dally et al. |
| 2013/0147517 | A1* | 6/2013 | Shon ................. G06F 1/10 326/80 |
| 2014/0269011 | A1* | 9/2014 | Dally ................ G11C 7/1069 365/149 |
| 2020/0067568 | A1 | 2/2020 | Spirkl et al. |

OTHER PUBLICATIONS

2020 IEEE Asian Solid-State Circuits Conference (A-SSCC) Program Book Nov. 9-11, 2020, Online, Sponsored by IEEE Solid-State Circuits Society (IEEE SSCS).

\* cited by examiner

OUTPUT DRIVER AND SEMICONDUCTOR MEMORY DEVICE HAVING THE SAME

CROSS-REFERENCE TO THE RELATED APPLICATION

This application claims priority under 35 U.S.C. § 119 to Korean Patent Application No. 10-2021-0016550, filed on Feb. 5, 2021 in the Korean Intellectual Property Office, the inventive concept of which is incorporated by reference herein in its entirety.

TECHNICAL FIELD

Embodiments of the inventive concept relate to an output driver and a semiconductor memory device having the same.

DISCUSSION OF RELATED ART

A transmission and reception system may include a transmitter, a receiver, and a channel transmitting data between the transmitter and the receiver. The transmitter may include an output driver, the output driver may drive internal data to generate data, and the data may be transmitted to the receiver through the channel.

When data is continuously transmitted through the channel, intersymbol interference (ISI), for example, pre-cursor interference with pre data and/or post-cursor interference with post data, may occur.

SUMMARY

According to embodiments of the inventive concept, an output driver includes a pre driver connected between a first driving supply voltage and a ground voltage, and including a first predetermined number of pre driving circuits, each including a first pre pump and a second pre pump commonly connected to a data terminal, and a main driver connected between a second driving supply voltage and the ground voltage, and including a second predetermined number of main driving circuits, each including a first main pump and a second main pump commonly connected to the data terminal. Each of the first pre pump and the second pre pump includes a first driving capacitor, and each of the first main pump and the second main pump includes a second driving capacitor. In a first frequency mode operation, during a first half cycle of a clock signal, the first pre pump performs a precharge operation on the first driving capacitor, the first main pump performs the precharge operation on the second driving capacitor, the second pre pump performs a first driving operation on the first driving capacitor in response to inverted even pre data, and the second main pump performs the first driving operation on the second driving capacitor in response to odd data, and during a second half cycle of the clock signal, the first pre pump performs the first driving operation on the first driving capacitor in response to inverted odd pre data, the first main pump performs the first driving operation on the second driving capacitor in response to even data, the second pre pump performs the precharge operation on the first driving capacitor, and the second main pump performs the precharge operation on the second driving capacitor. A capacitance of the first driving capacitor and a capacitance of the second driving capacitor are different from each other.

According to embodiments of the inventive concept, an output driver includes: a main driver connected between a first driving supply voltage and a ground voltage, and including a first predetermined number of main driving circuits, each including a first main pump and a second main pump commonly connected to a data terminal, and a post driver connected between a second driving supply voltage and the ground voltage, and including a second predetermined number of post driving circuits, each including a first post pump and a second post pump commonly connected to the data terminal. Each of the first main pump and the second main pump includes a first driving capacitor, and each of the first post pump and the second post pump includes a second driving capacitor. In a first frequency mode operation, during a first half cycle of a clock signal, the first main pump performs a precharge operation on the first driving capacitor, the first post pump performs the precharge operation on the second driving capacitor, the second main pump performs a first driving operation on the first driving capacitor in response to odd data, and the second post pump performs the first driving operation on the second driving capacitor in response to inverted even post data, and during a second half cycle of the clock signal, the first main pump performs the first driving operation on the first driving capacitor in response to even data, the first post pump performs the first driving operation on the second driving capacitor in response to inverted even post data, the second main pump performs the precharge operation on the first driving capacitor, and the second post pump performs the precharge operation on the second driving capacitor. A capacitance of the first driving capacitor and a capacitance of the second driving capacitor are different from each other.

According to embodiments of the inventive concept, a semiconductor memory device includes a row decoder configured to generate a plurality of word line selection signals in response to a row address, a column decoder configured to generate a plurality of column selection signals in response to a column address, a memory cell array including a plurality of memory cells, and configured to output data, stored in memory cells selected by the plurality of word line selection signals and the plurality of column selection signals, as read data, a data read path circuit configured to receive the read data to generate data, output drivers configured to drive the data to generate output data, and data terminals connected to the output drivers, respectively. Each of the output drivers includes a pre driver connected between a first driving supply voltage and a ground voltage, and including a first predetermined number of pre driving circuits, each including a first pre pump and a second pre pump commonly connected to the data terminal, and a main driver connected between a second driving supply voltage and the ground voltage, and including a second predetermined number of main driving circuits, each including a first main pump and a second main pump commonly connected to the data terminal. Each of the first pre pump and the second pre pump includes a first driving capacitor, and each of the first main pump and the second main pump includes a second driving capacitor. In a first frequency mode operation, during a first half cycle of a clock signal, the first pre pump performs a precharge operation on the first driving capacitor, the first main pump performs the precharge operation on the second driving capacitor, the second pre pump performs a first driving operation on the first driving capacitor in response to inverted even pre data, and the second main pump performs the first driving operation on the second driving capacitor in response to odd data, and during a second half cycle of the clock signal, the first pre pump performs the first driving operation on the first driving capacitor in response to inverted odd pre data, the first main pump performs the first driving operation on the second driving capacitor in response to even data, the second pre pump performs the precharge operation on the first driving capacitor, and the second main pump performs the precharge operation on the second driving capacitor. A capacitance of the first driving capacitor and a capacitance of the second driving capacitor are different from each other.

BRIEF DESCRIPTION OF THE DRAWINGS

The above and other aspects of the inventive concept will become more apparent by describing in detail embodiments thereof with reference to the accompanying drawings.

DETAILED DESCRIPTION OF EMBODIMENTS

Figure 1:
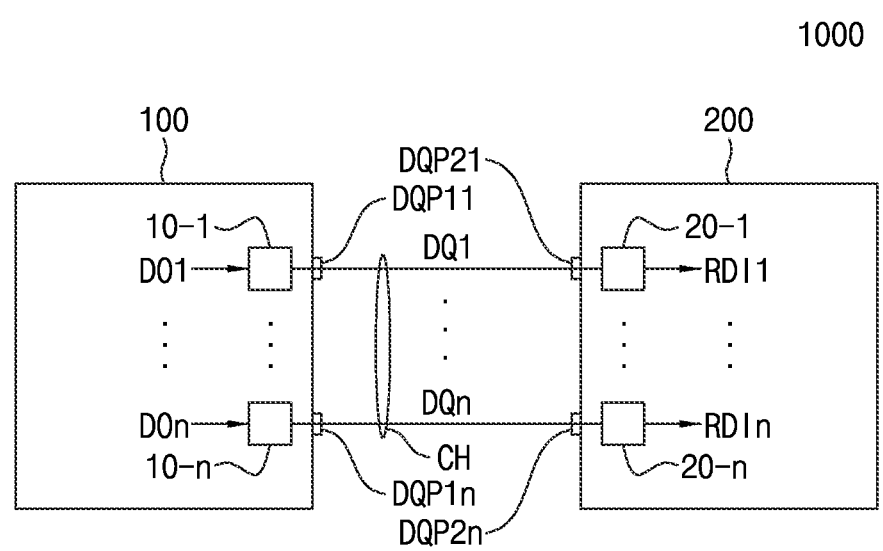
FIG. 1 is a block diagram illustrating a transmission and reception system according to an embodiment of the inventive concept.

Embodiments of the inventive concept provide an output driver capable of driving data by removing pre-cursor interference and/or post-cursor interference with adjacent data, and a semiconductor memory device having the same.

Hereinafter, an output driver and a semiconductor memory device having the same according to embodiments of the inventive concept will be described with reference to the accompanying drawings. Like reference numerals may refer to like elements throughout this application.

FIG. 1 is a block diagram illustrating a transmission and reception system according to an embodiment of the inventive concept. A transmission and reception system 1000 may include a transmitter 100, a receiver 200, and a channel CH. The transmitter 100 may include n output drivers 10-1 to 10-$n$, and the receiver 200 may include n input drivers 20-1 to 20-$n$. The channel CH may include n lines.

Referring to FIG. 1, the n output drivers 10-1 to 10-$n$ may be connected to data terminals DQP11 to DQP1n, respectively, and in a high frequency mode operation, drive a positive voltage greater than a ground voltage when each of data DO1 to DOn has a "high" level and drive a negative voltage smaller than the ground voltage when each of data DO1 to DOn has a "low" level, to generate data DQ1 to DQn, respectively. In other words, in the high frequency mode operation, each of data DQ1 to DQn may be a return to zero (RZ) signal swinging between the positive voltage and the negative voltage. The high frequency mode operation may be referred to as a first frequency mode operation.

Further, in a low frequency mode operation, the n output drivers 10-1 to 10-$n$ may drive the positive voltage when each of the data DO1 to DOn is the "high" level and drive the ground voltage when each of the data DO1 to DOn is the "low" level, to generate the data DQ1 to DQn, respectively. In other words, in the low frequency mode operation, each of the data DQ1 to DQn may be a non-return to zero (NRZ) signal swinging between the positive voltage and the ground voltage. The low frequency mode operation may be referred to a second frequency mode operation.

Additionally, the n input drivers 20-1 to 20-$n$ may be connected to data terminals DQP21 to DQP2N, respectively, and in the high frequency mode operation, generate data RDI1 to RDIn having the "high" level when each of the data DQ1 to DQn is the positive voltage and generate the data RDI1 to RDIn having the "low" level when each of the data DQ1 to DQn is the negative voltage.

Further, in the low frequency operation mode, the n input drivers 20-1 to 20-$n$ may generate the data RDI1 to RDIn having the "high" level when each of the data DQ1 to DQn is the positive voltage, and generate the data RDI1 to RDIn having the "low" level when each of the data DQ1 to DQn is the ground voltage.

In FIG. 1, the transmitter 100 may be a semiconductor memory device and the receiver 200 may be a control unit, for example, a central processing unit (CPU), a graphic processing unit (GPU), etc. Alternatively, the transmitter 100 may be the control unit and the receiver 200 may be the semiconductor memory device.

Figure 2:
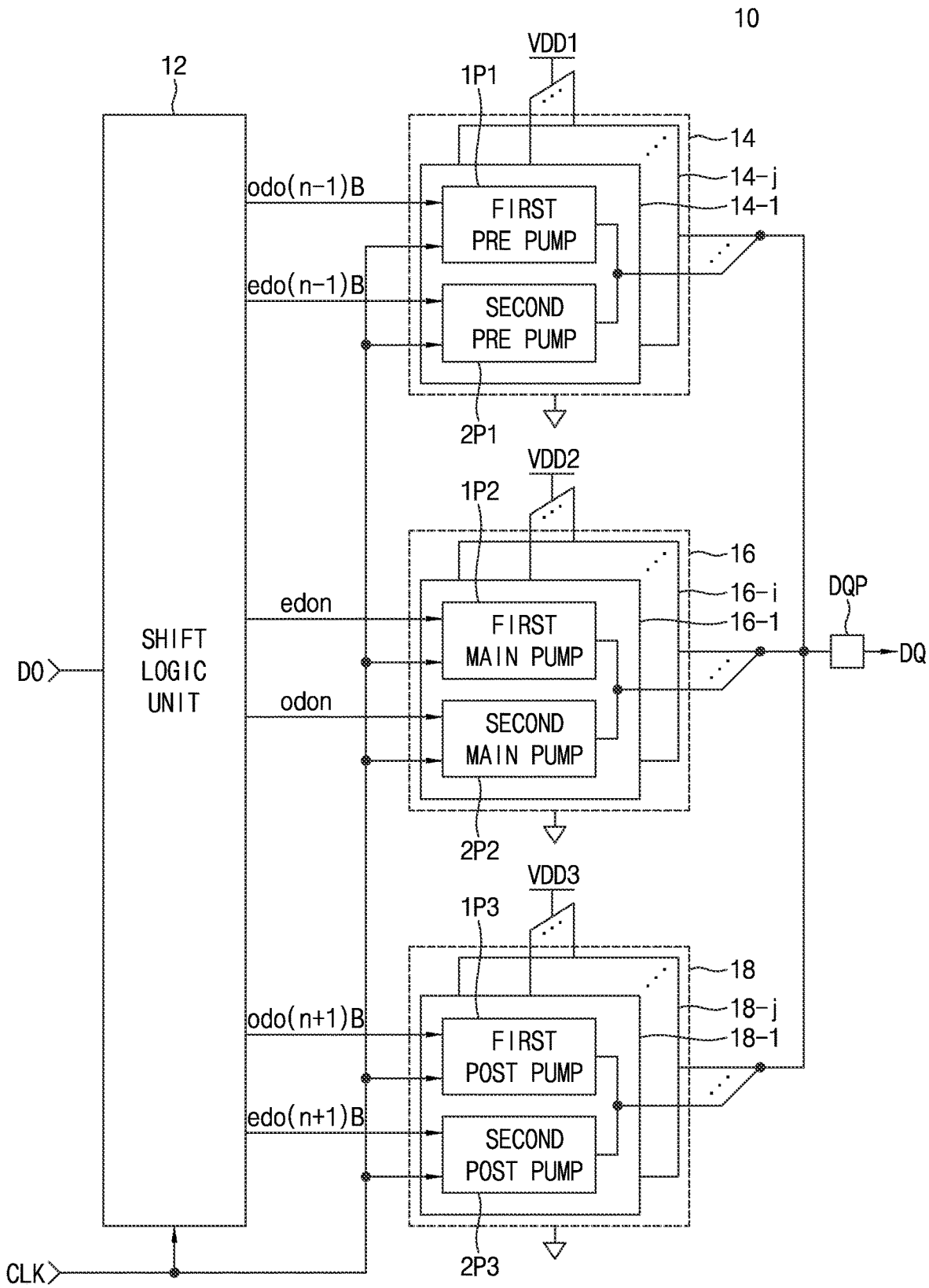
FIG. 2 is a block diagram illustrating a configuration of an output driver according to an embodiment of the inventive concept.

FIG. 2 is a block diagram illustrating a configuration of an output driver according to an embodiment of the inventive concept.

Referring to FIG. 2, an output driver 10 may include a shift logic unit 12, a pre driver 14, a main driver 16, and a post driver 18. The pre driver 14 may include j pre driving units (or circuits) 14-1 to 14-$j$ commonly connected to a data terminal DQP, the main driver 16 may include i main driving units (or circuits) 16-1 to 16-$i$ commonly connected to the data terminal DQP, and the post driver 18 may include j post driving units (or circuits) 18-1 to 18-$j$ commonly connected to the data terminal DQP. Each of the j pre driving units 14-1 to 14-$j$ may include a first pre pump 1P1 and a second pre pump 2P1 commonly connected to the data terminal DQP. Each of the i main driving units 16-1 to 16-$i$ may include a first main pump 1P2 and a second main pump 2P2 commonly connected to the data terminal DQP, and each of the j post driving units 18-1 to 18-j may include a first post pump 1P3 and a second post pump 2P3 commonly connected to the data terminal DQP.

Each of the first pre pump 1P1 and the second pre pump 2P1 may be connected between a first driving supply voltage VDD1 and a ground voltage, and include a first driving capacitor. During a first half cycle of a clock signal CLK, the first pre pump 1P1 may perform a precharge operation on the first driving capacitor, and the second pre pump 2P1 may perform a driving operation, e.g., a pumping operation (a charging operation or a discharging operation), on the first driving capacitor in response to inverted even pre data edo(n−1)B to generate data DQ. Further, during a second half cycle of the clock signal CLK, the second pre pump 2P1 may perform the precharge operation on the first driving capacitor, and the first pre pump 1P1 may perform the driving operation on the first driving capacitor in response to inverted odd pre data odo(n−1)B to generate the data DQ. In other words, in response to a first state of the clock signal CLK, the first pre pump 1P1 may perform the precharge operation on the first driving capacitor and the second pre pump 2P1 may perform the driving operation on the first driving capacitor in response to the inverted even pre data edo(n−1)B, and in response to a second state of the clock signal CLK, the first pre pump 1P1 may perform the driving operation on the first driving capacitor in response to the inverted odd pre data odo(n−1)B and the second pre pump 2P1 may perform the precharge operation on the first driving capacitor.

Each of the first main pump 1P2 and the second main pump 2P2 may be connected between a second driving supply voltage VDD2 and the ground voltage, include a second driving capacitor, and perform an operation similar to the first pre pump 1P1 and the second pre pump 2P1. In other words, during a first half cycle of the clock signal CLK, the first main pump 1P2 may perform a precharge operation on the second driving capacitor and the second main pump 2P2 may perform a driving operation on the second driving capacitor in response to odd main data odon, and during a second half cycle of the clock signal CLK, the first main pump 1P2 may perform the driving operation on the second driving capacitor in response to even main data edon and the second main pump 2P2 may perform the precharge operation on the second driving capacitor.

Each of the first post pump 1P3 and the second post pump 2P3 may be connected between a third driving supply voltage VDD3 and the ground voltage, include a third driving capacitor, and perform an operation similar to the first pre pump 1P1 and the second pre pump 2P1. In other words, during a first half cycle of the clock signal CLK, the first post pump 1P3 may perform a precharge operation on the third driving capacitor and the second post pump 2P3 may perform a driving operation on the third driving capacitor in response to inverted even post data edo(n+1)B, and during a second half cycle of the clock signal CLK, the first post pump 1P3 may perform the driving operation on the third driving capacitor in response to inverted odd post data odo(n+1)B and the second post pump 2P3 may perform the precharge operation on the third driving capacitor.

The first driving supply voltage VDD1, the second driving supply voltage VDD2, and the third driving supply voltage VDD3 may be the same or different from one another. For example, the second driving supply voltage VDD2 may be greater than the third driving supply voltage VDD3, and the third driving supply voltage VDD3 may be greater than the first driving supply voltage VDD1. A capacitance of the first driving capacitor, a capacitance of the second driving capacitor, and a capacitance of the third driving capacitor may be the same or different from one another. For example, the capacitance of the second driving capacitor may be greater than that of the third driving capacitor, and the capacitance of the third driving capacitor may be greater than that of the first driving capacitor.

Figure 3:
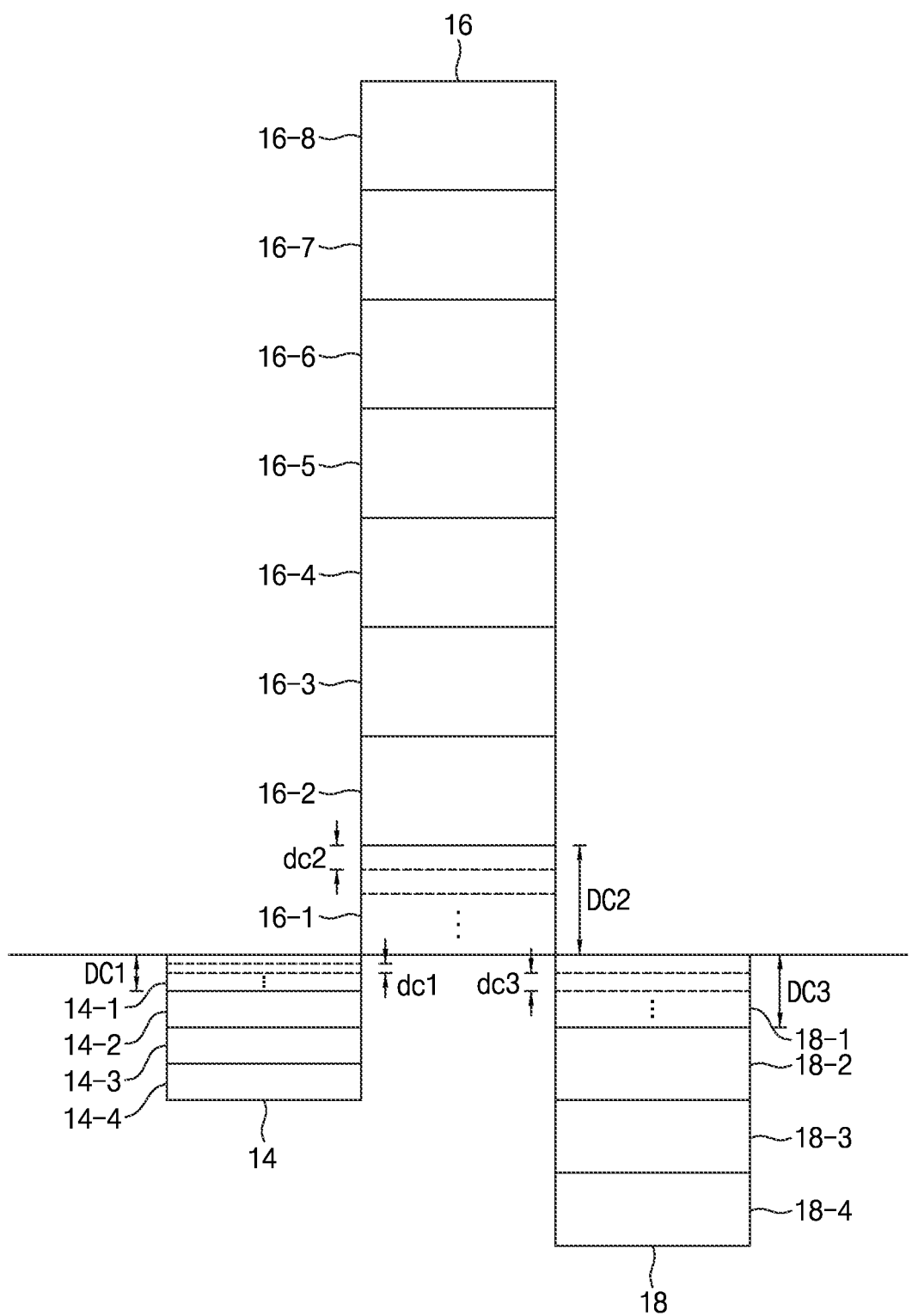
FIG. 3 is a diagram for describing driving capabilities of a pre driver, a main driver, and a post driver according to an embodiment of the inventive concept.

FIG. 3 is a diagram for describing driving capabilities of a pre driver, a main driver, and a post driver according to an embodiment of the inventive concept, and shows driving capabilities when the pre driver 14 includes 4 pre driving units 14-1 to 14-4, the main driver 16 includes 8 main driving units 16-1 to 16-8, and the post driver 18 includes 4 post driving units 18-1 to 18-4.

Referring to FIG. 3, a first driving capability of each of the 4 pre driving units 14-1 to 14-4 may be represented by DC1, a second driving capability of each of the 8 main driving units 16-1 to 16-8 may be represented by DC2, and a third driving capability of each of the 4 post driving units 18-1 to 18-4 may be represented by DC3. For example, the capacitance of the second driving capacitor of each of the 8 main driving units 16-1 to 16-8, the capacitance of the first driving capacitor of each of the 4 pre driving units 14-1 to 14-4, and the capacitance of the third driving capacitor of each of the 4 post driving units 18-1 to 18-4 may have a size ratio of 1:0.2:0.5, and thus have driving capabilities different from one another. In other words, the driving capability of each of the pre driver 14, the main driver 16, and the post driver 18 may be coarsely tuned according to the number of the pre driving units, the number of the main driving units, and the number of the post driving units that are activated.

Further, the first driving capability DC1 may be finely tuned by adjusting the first driving supply voltage VDD1. In other words, the first driving capability DC1 may be gradually decreased by a size dc1 by decreasing the first driving supply voltage VDD1. Likewise, the second driving capability DC2 may be finely tuned by a size dc2 by adjusting the second driving supply voltage VDD2, and the third driving capability DC3 may be finely tuned by a size dc3 by adjusting the third driving supply voltage VDD3. Unlike what is shown, the first to third driving supply voltages VDD1, VDD2, and VDD3 may be linearly adjusted.

Figure 4:
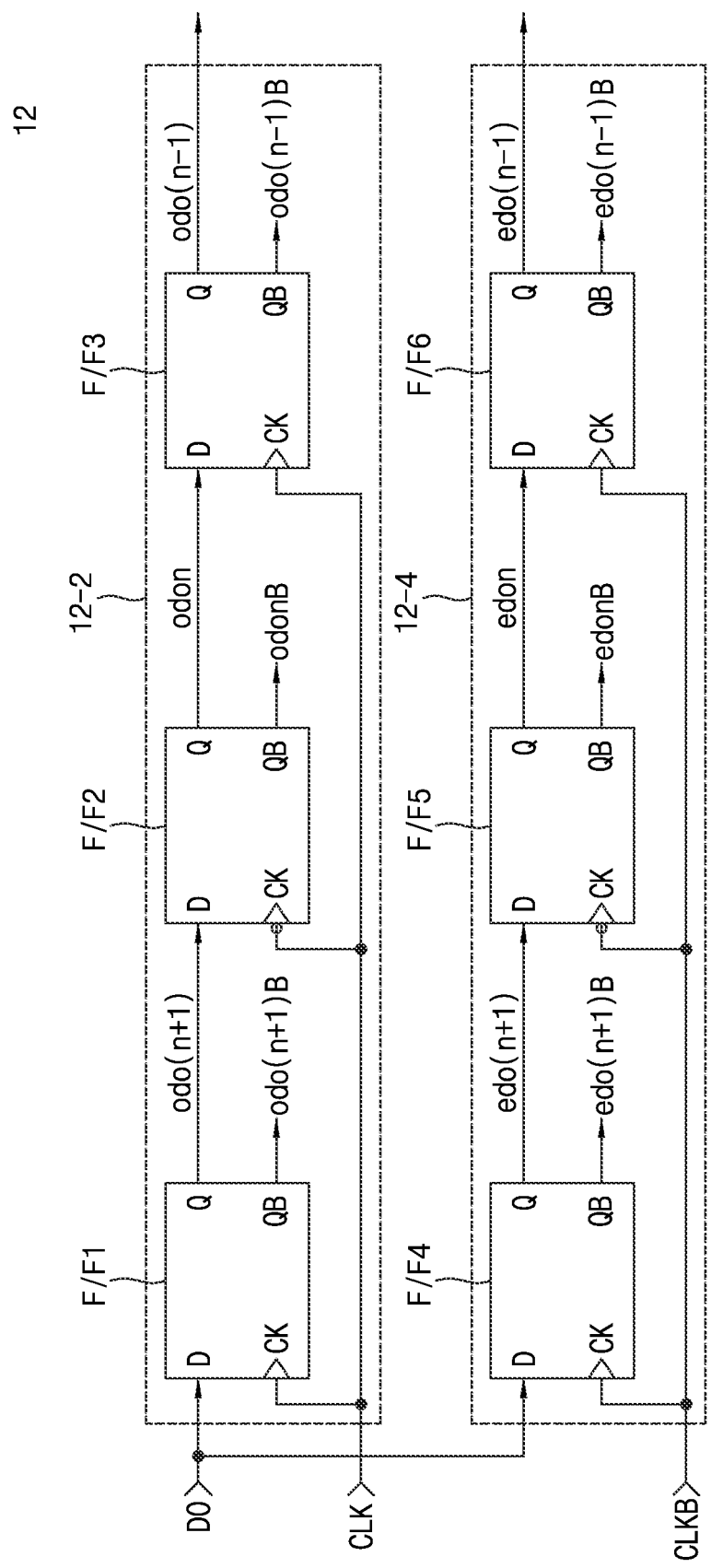
FIG. 4 is a diagram illustrating a configuration of a shift logic unit according to an embodiment of the inventive concept.

FIG. 4 is a diagram illustrating a configuration of a shift logic unit according to an embodiment of the inventive concept. A shift logic unit 12 may include a first shifting unit 12-2 and a second shifting unit 12-4. The first shifting unit 12-2 may include a first flip-flop F/F1 to a third flip-flop F/F3, and the second shifting unit 12-4 may include a fourth flip-flop F/F4 to a sixth flip-flop F/F6. Each of the first flip-flop F/F1 to the sixth flip-flop F/F6 may include a data terminal D, a clock signal terminal CK, an output terminal Q, and an inverted output terminal QB.

Referring to FIG. 4, the first flip-flop F/F1 may latch data DO to generate odd post data odo(n+1) and inverted odd post data odo(n+1)B in response to a rising transition of the clock signal CLK. The second flip-flop F/F2 may latch the odd post data odo(n+1) to generate odd main data odon and inverted odd main data odonB in response to a falling transition of the clock signal CLK. The third flip-flop F/F3 may latch the odd main data odon to generate odd pre data odo(n−1) and inverted odd pre data odo(n−1)B in response to a rising transition of the clock signal CLK. In other words, the first shifting unit 12-2 may latch the data DO in response to the rising transition of the clock signal CLK, and perform a shifting operation to generate the odd post data odo(n+1), the odd main data odon, and the odd pre data odo(n−1) in response to the rising transition and the falling transition of the clock signal CLK.

The fourth flip-flop F/F4 may latch the data DO to generate even post data edo(n+1) and inverted even post data edo(n+1)B in response to a rising transition of an inverted clock signal CLKB. The fifth flip-flop F/F5 may latch the even post data edo(n+1) to generate even main data edon and inverted even main data edonB in response to a falling transition of the inverted clock signal CLKB. The sixth flip-flop F/F6 may latch the even main data edon to generate even pre data edo(n−1) and inverted even pre data edo(n−1)B in response to the rising transition of the inverted clock signal CLKB. In other words, the second shifting unit 12-4 may latch the data DO in response to the rising transition of the inverted clock signal CLKB, perform a shifting operation to generate the even post data edo(n+1), the even main data edon, and the even pre data edo(n−1) in response to the rising transition and the falling transition of the inverted clock signal CLKB.

Figure 5:
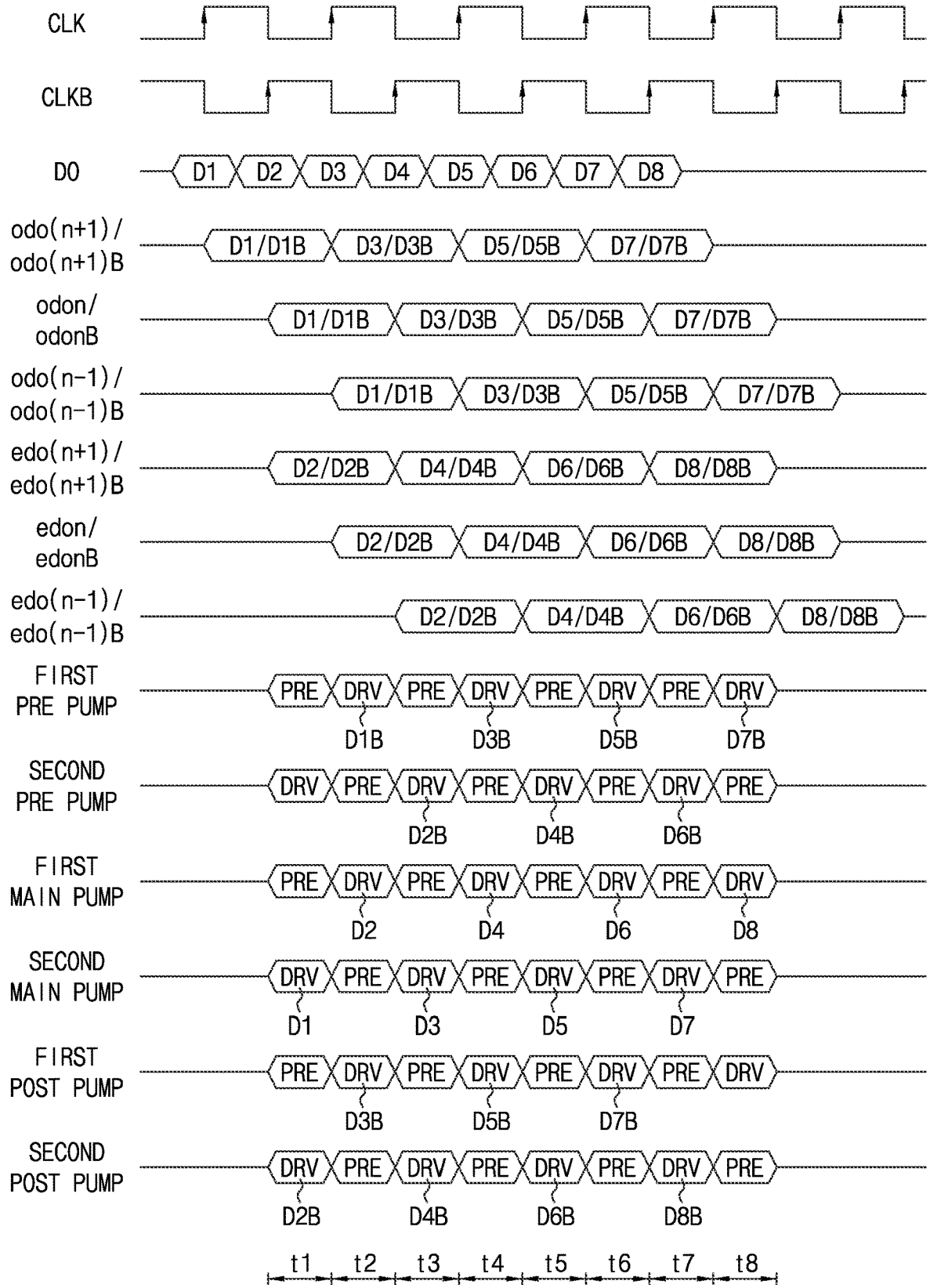
FIG. 5 is an operation timing diagram for describing an operation of an output driver according to an embodiment of the inventive concept.

FIG. 5 is an operation timing diagram for describing an operation of an output driver according to an embodiment of the inventive concept, and shows the operation of the output driver when 8 data D1 to D8 is sequentially generated in response to a rising transition and a falling transition of the clock signal CLK.

The operation of the output driver 10 is described with reference to FIGS. 1 to 5.

The first flip-flop F/F1 may sequentially latch data D1, D3, D5, and D7 to sequentially generate odd post data odo(n+1) and inverted odd post data odo(n+1)B in response to the rising transition of the clock signal CLK, the second flip-flop F/F2 may latch the odd post data odo(n+1) to generate odd main data odon and inverted odd main data odonB in response to the falling transition of the clock signal CLK, and the third flip-flop F/F3 may latch the odd main data odon to generate odd pre data odo(n−1) and inverted odd pre data odo(n−1)B in response to the rising transition of the clock signal CLK. The fourth flip-flop F/F4 may sequentially latch data D2, D4, D6, and D8 to sequentially generate even post data edo(n+1) and inverted even post data edo(n+1)B in response to the rising transition of the inverted clock signal CLKB, the fifth flip-flop F/F5 may latch the even post data edo(n+1) to generate even main data edon and inverted even main data edonB in response to the falling transition of the inverted clock signal CLKB, and the sixth flip-flop F/F6 may latch the even main data edon to generate even pre data edo(n−1) and inverted even pre data edo(n−1)B in response to the rising transition of the inverted clock signal CLKB.

During cycles t1, t3, t5, and t7 in which the clock signal CLK is at a first state, for example, a "low" level, the first pre pump 1P1, the first main pump 1P2, and the first post pump 1P3 may perform a precharge operation PRE, and the second pre pump 2P1, the second main pump 2P2, and the second post pump 2P3 may perform a driving operation DRV, e.g., a pumping operation. During cycles t2, t4, t6, and t8 in which the clock signal CLK is at a second state, for example, a "high" level, the first pre pump 1P1, the first main pump 1P2, and the first post pump 1P3 may perform the driving operation DRV, and the second pre pump 2P1, the second main pump 2P2, and the second post pump 2P3 may perform the precharge operation PRE.

During the cycle t1, the second main pump 2P2 may perform the driving operation DRV in response to data D1 which is the odd main data odon, and the second post pump 2P3 may perform the driving operation DRV in response to inverted data D2B which is the inverted even post data edo(n+1)B. Accordingly, post-cursor interference between the main data D1 and the post data D2 may be removed.

During the cycle t2, the first pre pump 1P1 may drive the driving operation DRV in response to inverted data D1B which is the inverted odd pre data odo(n−1)B, the first main pump 1P2 may perform the driving operation DRV in response to data D2 which is the even main data edon, and the first post pump 1P3 may perform the driving operation DRV in response to inverted data D3B which is the inverted odd post data odo(n+1)B. Accordingly, pre-cursor interference between the pre data D1 and the main data D2 and post-cursor interference between the main data D2 and the post data D3 may be removed.

During the cycle t3, the second pre pump 2P1 may perform the driving operation DRV in response to inverted data D2B which is the inverted even pre data edo(n−1)B, the second main pump 2P2 may perform the driving operation DRV in response to the data D3 which is the odd main data odon, and the second post pump 2P3 may perform the driving operation DRV in response to inverted data D4B which is the inverted even post data edon(n+1)B. Accordingly, pre-cursor interference between the pre data D2 and the main data D3 and post-cursor interference between the main data D3 and the post data D4 may be removed.

In a similar manner as described above, during the cycle t4, the first pre pump 1P1 may perform the driving operation DRV in response to inverted data D3B, the first main pump 1P2 may perform the driving operation DRV in response to data D4, and the first post pump 1P3 may perform the driving operation DRV in response to inverted data D5B. Similar operations may be performed for cycles t5 to t7. Finally, during the cycle t8, the first pre pump 1P1 may perform the driving operation DRV in response to inverted data D7B, and the first main pump 1P2 may perform the driving operation DRV in response to data D8.

The output driver 10 according to the present embodiment to the inventive concept as described above may simultaneously perform the driving operation in response to the main data and the driving operation in response to adjacent inverted pre data, and/or the driving operation in response to the main data and the driving operation in response to adjacent inverted post data. Accordingly, the main data may be generated by removing pre-cursor interference due to the pre data and/or post-cursor interference due to the post data.

Figure 6:
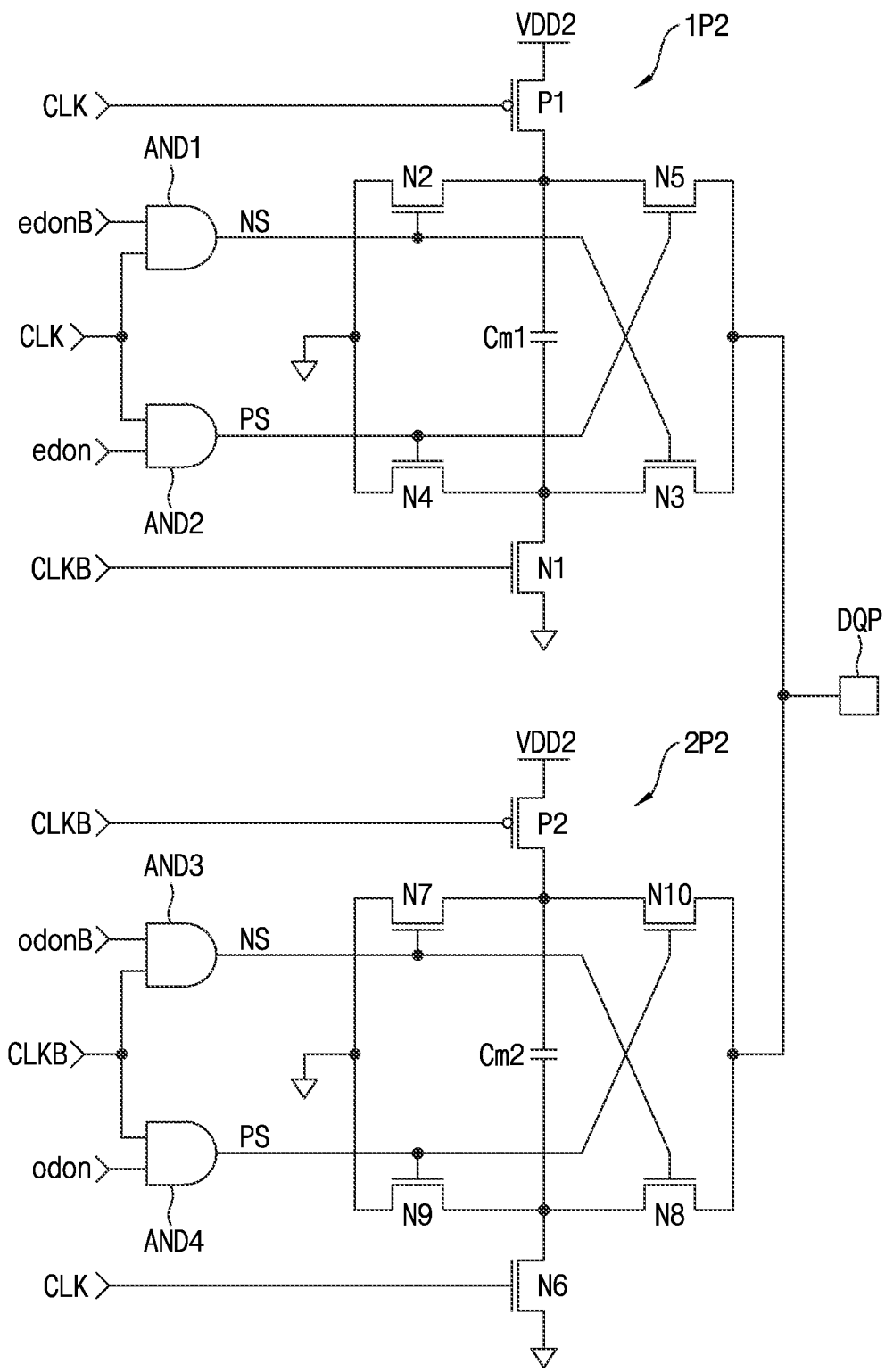
FIG. 6 is a circuit diagram illustrating configurations of a first main pump and a second main pump according to an embodiment of the inventive concept.

FIG. 6 is a circuit diagram illustrating configurations of a first main pump and a second main pump according to an embodiment of the inventive concept. The first main pump 1P2 may include a first AND circuit AND1, a second AND circuit AND2, a first PMOS transistor P1, a first NMOS transistor to a fifth NMOS transistor N1 to N5, and a first driving capacitor Cm1. The second main pump 2P2 may include a third AND circuit AND3, a fourth AND circuit AND4, a second PMOS transistor P2, a sixth NMOS transistor to a tenth NMOS transistor N6 to N10, and a second driving capacitor Cm2. In other words, the first main pump 1P2 and the second main pump 2P2 may have substantially the same configuration.

The first PMOS transistor P1 may be connected between the second driving supply voltage VDD2 and a first node, and configured to be turned on in response to a first state of the clock signal CLK.

The first NMOS transistor N1 may be connected between a second node and the ground voltage, and configured to be turned on in response to a second state of the inverted clock signal CLKB.

The second NMOS transistor N2 may be connected between the ground voltage and the first node, and configured to be turned on in response to a negative driving signal NS.

The third NMOS transistor N3 may be connected between the second node and the data terminal DQP, and configured to be turned on in response to the negative driving signal NS.

The fourth NMOS transistor N4 may be connected between the ground voltage and the second node, and configured to be turned on in response to a positive driving signal PS.

The fifth NMOS transistor N5 may be connected between the first node and the data terminal DQP, and configured to be turned on in response to the positive driving signal PS.

The first driving capacitor Cm1 may be connected between the first node and the second node.

The second PMOS transistor P2 may be connected between the second driving supply voltage VDD2 and a third node, and configured to be turned on in response to a first state of the inverted clock signal CLKB.

The sixth NMOS transistor N6 may be connected between a fourth node and the ground voltage, and configured to be turned on in response to a second state of the clock signal CLK.

The seventh NMOS transistor N7 may be connected between the ground voltage and the third node, and configured to be turned on in response to the negative driving signal NS.

The eighth NMOS transistor N8 may be connected between the fourth node and the data terminal DQP, and configured to be turned on in response to the negative driving signal NS.

The ninth NMOS transistor N9 may be connected between the ground voltage and the fourth node, and configured to be turned on in response to the positive driving signal PS.

The tenth NMOS transistor N10 may be connected between the third node and the data terminal DQP, and configured to be turned on in response to the positive driving signal PS.

The second driving capacitor Cm2 may be connected between the third node and the fourth node.

The first AND circuit AND1 and the second AND circuit AND2 may together be referred to as an AND circuit in the first main pump 1P2 for generating the negative driving signal NS and the positive driving signal PS. Similarly, the third AND circuit AND3 and the fourth AND circuit AND4 may together be referred to as an AND circuit in the second main pump 2P2 for generating the negative driving signal NS and the positive driving signal PS.

An operation of the first main pump 1P2 and the second main pump 2P2 is described with reference to FIG. 6.

When the clock signal CLK has a "low" level and the inverted clock signal CLKB has a "high" level, in the first main pump 1P2, the first PMOS transistor P1 and the first NMOS transistor N1 may be turned on, and the first driving capacitor Cm1 may be charged to a precharge voltage. In this case, in the second main pump 2P2, the third AND circuit AND3 may generate the negative driving signal NS having a "high" level" when inverted odd main data odonB has a "high" level, the seventh NMOS transistor N7 and the eighth NMOS transistor N8 may be turned on in response to the negative driving signal NS having the "high" level, and the second driving capacitor Cm2 may perform a driving operation to generate a negative voltage to the data terminal DQP. On the other hand, in the second main pump 2P2, the fourth AND circuit AND4 may generate the positive driving signal PS having a "high" level when odd main data odon has a "high" level, the ninth NMOS transistor N9 and the tenth NMOS transistor N10 may be turned on in response to the positive driving signal PS having the "high" level, and the second driving capacitor Cm2 may perform a driving operation to generate a positive voltage to the data terminal DQP.

When the clock signal CLK has a "high" level and the inverted clock signal CLKB has a "low" level, in the second main pump 2P2, the second PMOS transistor P2 and the sixth NMOS transistor N6 may be turned on, and the second driving capacitor Cm2 may be charged to a precharge voltage. In this case, in the first main pump 1P2, the first AND circuit AND1 may generate the negative driving signal NS having a "high" level" when inverted even main data edonB has a "high" level, the second NMOS transistor N2 and the third NMOS transistor N3 may be turned on in response to the negative driving signal NS having the "high" level, and the first driving capacitor Cm1 may perform a driving operation to generate a negative voltage to the data terminal DQP. On the other hand, in the first main pump 1P2, the second AND circuit AND2 may generate the positive driving signal PS having a "high" level when even main data edon has a "high" level, the fourth NMOS transistor N4 and the fifth NMOS transistor N5 may be turned on in response to the positive driving signal PS having the "high" level, and the first driving capacitor Cm1 may perform a driving operation to generate a positive voltage to the data terminal DQP.

According to an embodiment of the inventive concept, the first pre pump 1P1, the second pre pump 2P1, the first post pump 1P3, and the second post pump 2P3 may have substantially the same configuration as the first main pump 1P2 and the second main pump 2P2, and perform substantially the same operation in response to corresponding data.

Figure 7:
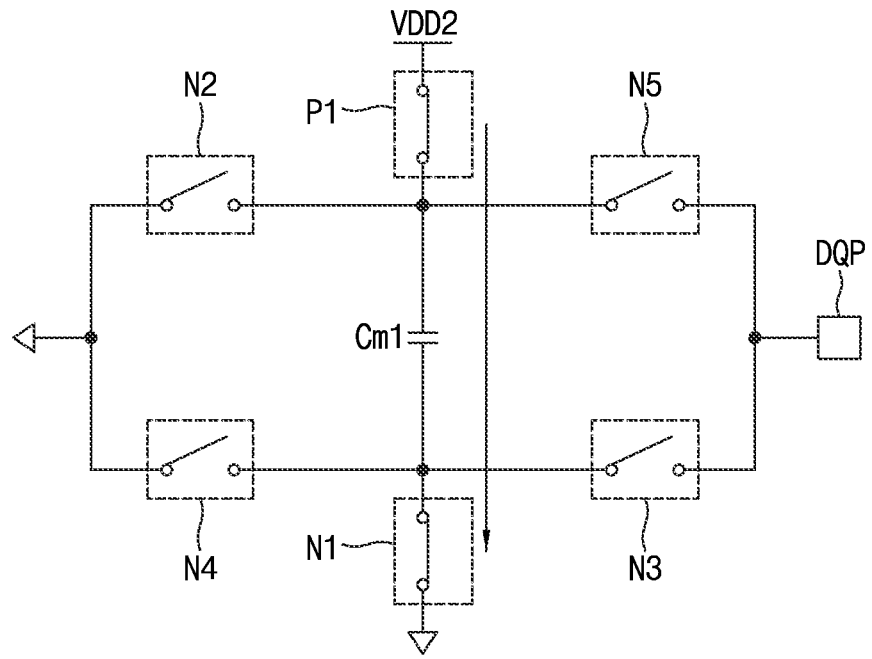
FIG. 7 is a conceptual diagram for describing a precharge operation of a main pump of an output driver according to an embodiment of the inventive concept.

FIG. 7 is a conceptual diagram for describing a precharge operation of a main pump of an output driver according to an embodiment of the inventive concept. In FIG. 7, the first PMOS transistor P1 and the first NMOS transistor N1 shown in FIG. 6 may be shown as switches having an on state, and the second NMOS transistor N2 to the fifth NMOS transistor N5 shown in FIG. 6 may be shown as switches having an off state.

Referring to FIG. 7, in a precharge operation, a current path may be formed through the first PMOS transistor P1, the first driving capacitor Cm1, and the first NMOS transistor N1, and the first driving capacitor Cm1 may be charged to a precharge voltage.

Figure 8:
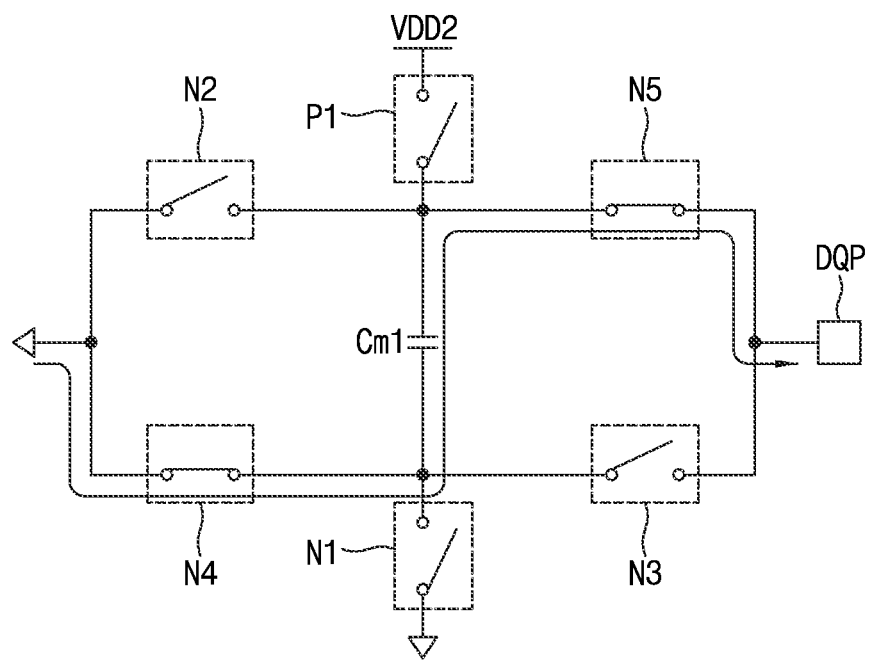
FIG. 8 is a conceptual diagram for describing a driving operation of a main pump of an output driver according to an embodiment of the inventive concept.

FIG. 8 is a conceptual diagram for describing a driving operation of a main pump of an output driver according to an embodiment of the inventive concept. In FIG. 8, the fourth NMOS transistor N4 and the fifth NMOS transistor N5 shown in FIG. 6 may be shown as switches having an on state, and the first PMOS transistor P1 and the first NMOS transistor N1 to the third NMOS transistor N3 shown in FIG. 6 may be shown as switches having an off state.

Referring to FIG. 8, in a driving operation, a current path may be formed from the ground voltage to the data terminal DQP through the fourth NMOS transistor N4, the first driving capacitor Cm1, and the fifth NMOS transistor N5, and a current may flow to the data terminal DQP. Accordingly, a positive voltage may be generated at the data terminal DQP.

Figure 9:
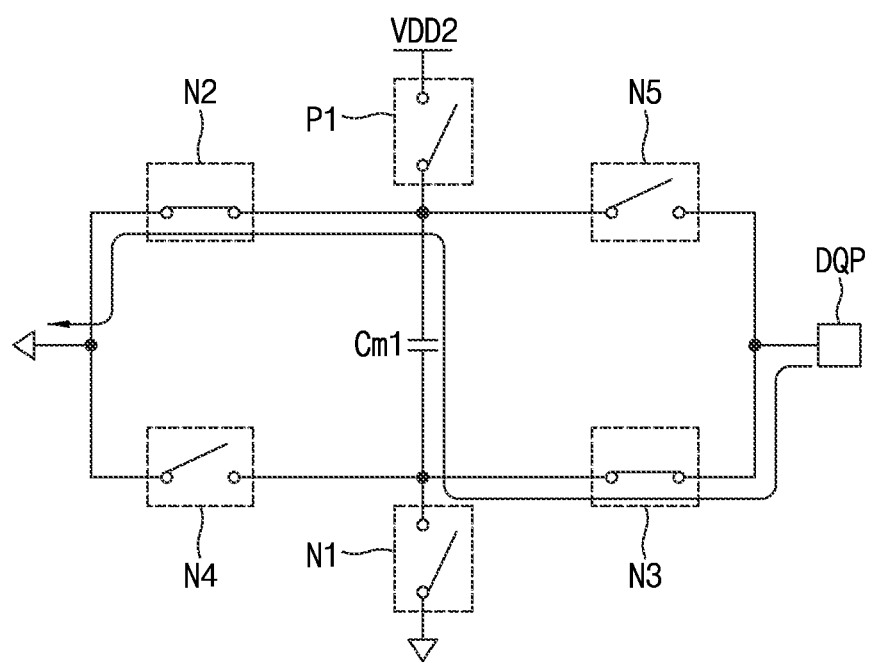
FIG. 9 is a conceptual diagram for describing a driving operation of a main pump of an output driver according to an embodiment of the inventive concept.

FIG. 9 is a conceptual diagram for describing a driving operation of a main pump of an output driver according to an embodiment of the inventive concept. In FIG. 9, the second NMOS transistor N2 and the third NMOS transistor N3 shown in FIG. 6 may be shown as switches having an on state, and the first PMOS transistor P1, the first NMOS transistor N1, the fourth NMOS transistor N4, and the fifth NMOS transistor N5 shown in FIG. 6 may be shown as switches having an off state.

Referring to FIG. 9, in a driving operation, a current path may be formed from the data terminal DQP to a ground voltage through the third NMOS transistor N3, the first driving capacitor Cm1, and the second NMOS transistor N2, and a current may flow to the ground voltage. Accordingly, a negative voltage may be generated at the data terminal DQP.

According to an embodiment of the inventive concept, each of the second main pump 2P2, the first pre pump 1P1, the second pre pump 2P1, the first post pump 1P3, and the second post pump 2P3 may perform substantially the same operation as described above with reference to FIGS. 7 to 9.

Figure 10:
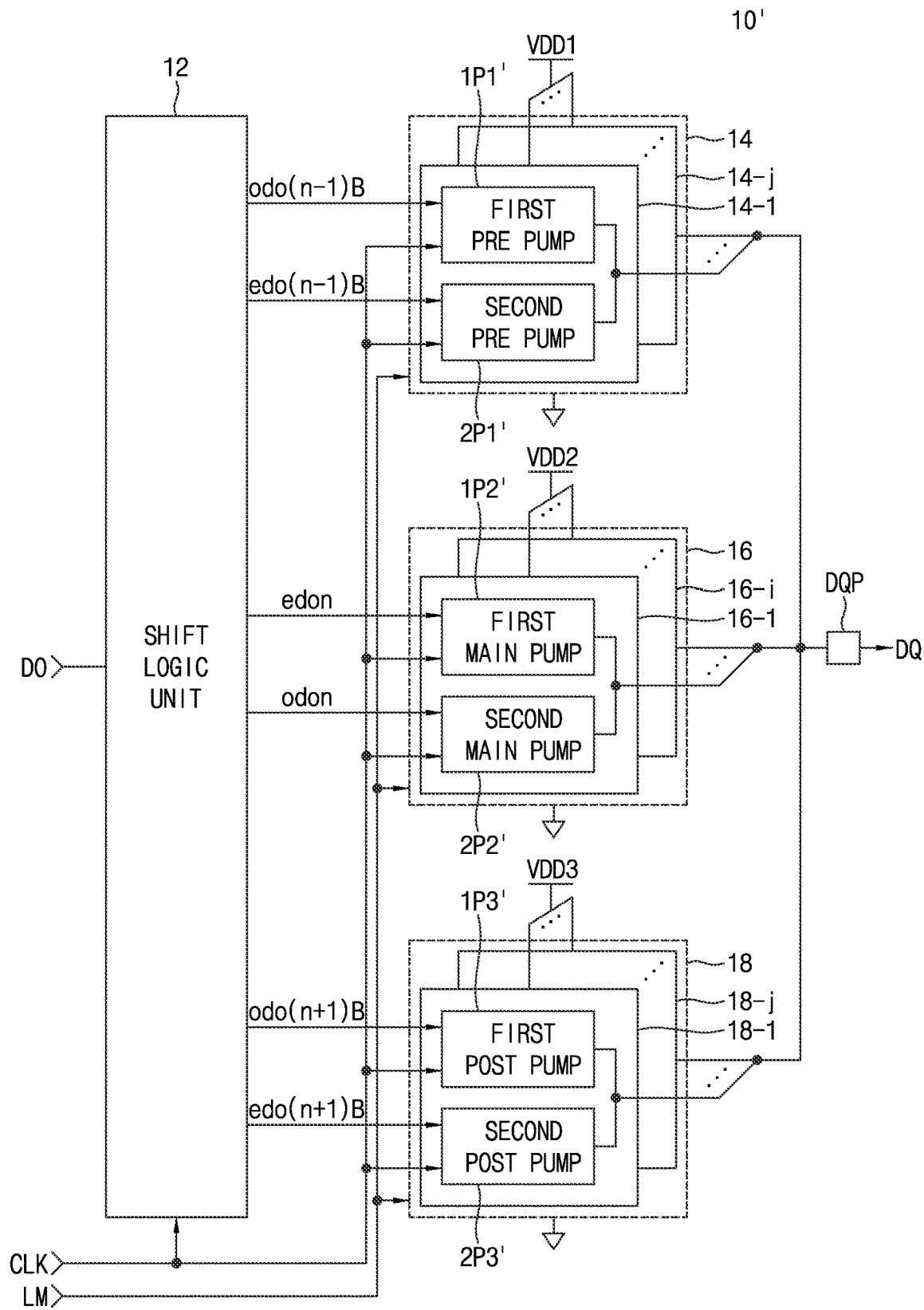
FIG. 10 is a block diagram illustrating a configuration of an output driver according to an embodiment of the inventive concept.

FIG. 10 is a block diagram illustrating a configuration of an output driver according to an embodiment of the inventive concept. An output driver 10' may have substantially the same configuration as the output driver 10 shown in FIG. 2 except that each of pre driving units 14-1 to 14-$j$ of the output driver 10' includes a first pre pump 1P1' and a second pre pump 2P1', each of main driving units 16-1 to 16-$i$ includes a first main pump 1P2' and a second main pump 2P2', each of post driving units 18-1 to 18-$j$ includes a first post pump 1P3' and a second post pump 2P3', and a low frequency mode signal LM is applied.

An operation of the output driver 10' shown in FIG. 10 is described below.

When the low frequency mode signal LM is deactivated, e.g., in a high frequency mode operation, the output driver 10' shown in FIG. 10 may perform substantially the same operation as described above with reference to FIGS. 1 to 9.

On the other hand, when the low frequency mode signal LM is activated, e.g., in a low frequency mode operation, the first pre pump 1P1', the second pre pump 2P1', the first post pump 1P3', and the second post pump 2P3' may not perform an operation, and only the first main pump 1P2' and the second main pump 2P2' may perform an operation. During a first half cycle of the clock signal CLK, the first main pump 1P2' may not perform a precharge operation, and the second main pump 2P2' may perform a driving operation in response to main odd data odon. Further, during a second half cycle of the clock signal CLK, the first main pump 1P2' may perform the driving operation in response to main even data edon, and the second main pump 2P2' may not perform the precharge operation.

Figure 11:
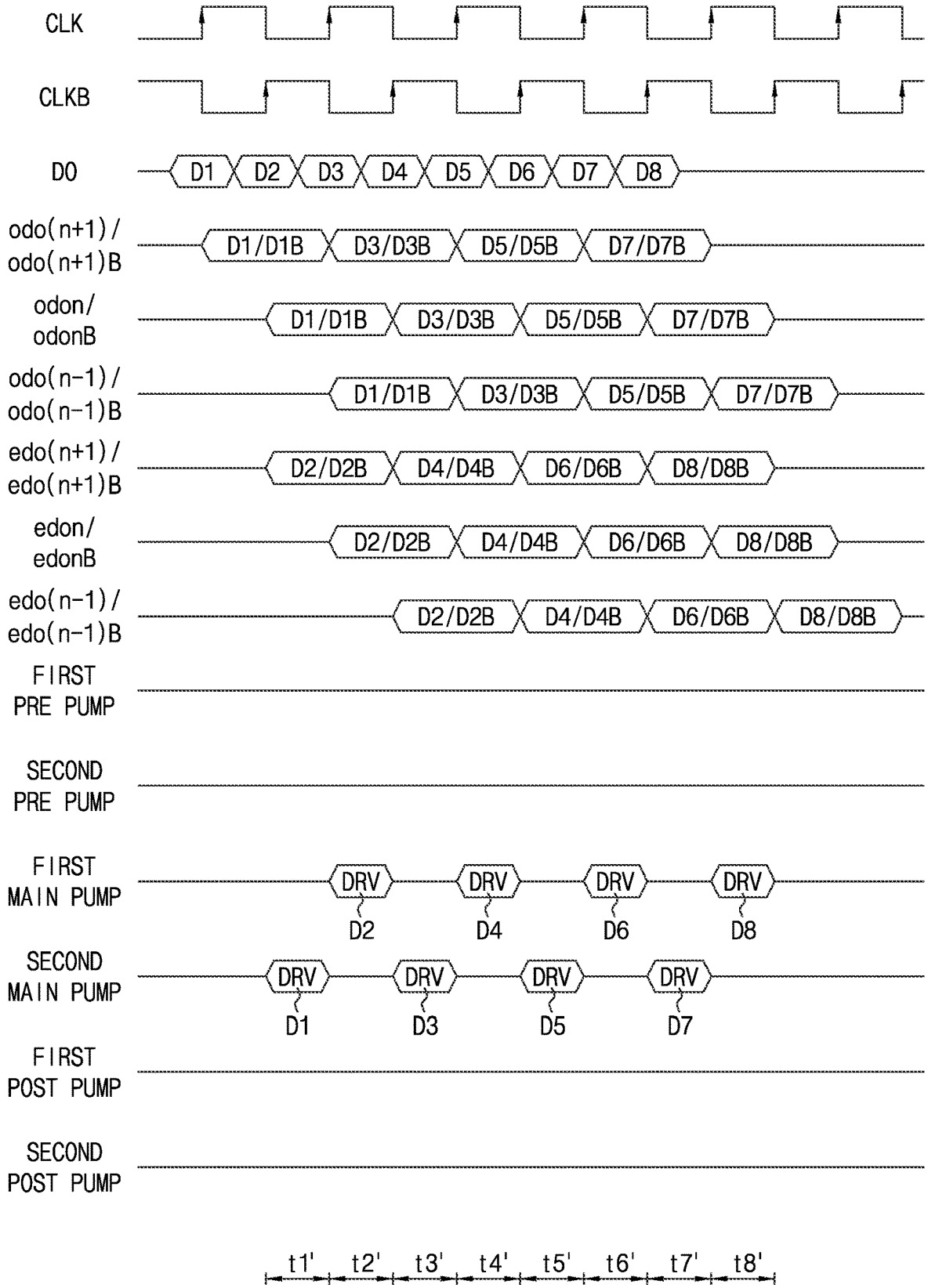
FIG. 11 is an operation timing diagram for describing a driving operation of an output driver in a low frequency mode operation of an output driver according to an embodiment of the inventive concept.

FIG. 11 is an operation timing diagram for describing a driving operation of an output driver in a low frequency mode operation according to an embodiment of the inventive concept. FIG. 11 is an operation timing diagram showing an operation of the output driver when 8 data D1 to D8 are sequentially generated in response to a rising transition and a falling transition of the clock signal CLK. The clock signal CLK shown in FIG. 11 may have a frequency lower than the clock signal CLK shown in FIG. 5. In other words, cycles t1' to t8' shown in FIG. 11 may be greater than the cycles t1 to t8 shown in FIG. 5.

Referring back to FIG. 5, each of the first pre pump 1P1, the second pre pump 2P1, the first main pump 1P2, the second main pump 2P2, the first post pump 1P3, and the second post pump 2P3 of the output driver 10 shown in FIG. 5 alternately perform the precharge operation PRE and the driving operation DRY. In contrast, referring to FIG. 11, each of the first pre pump 1P1', the second pre pump 2P1', the first post pump 1P3', and the second post pump 2P3' of the output driver 10' shown in FIG. 10 may not perform an operation, and the first main pump 1P2' and the second main pump 2P2' shown in FIG. 10 may not perform the precharge operation PRE and perform only the driving operation DRY.

Figure 12:
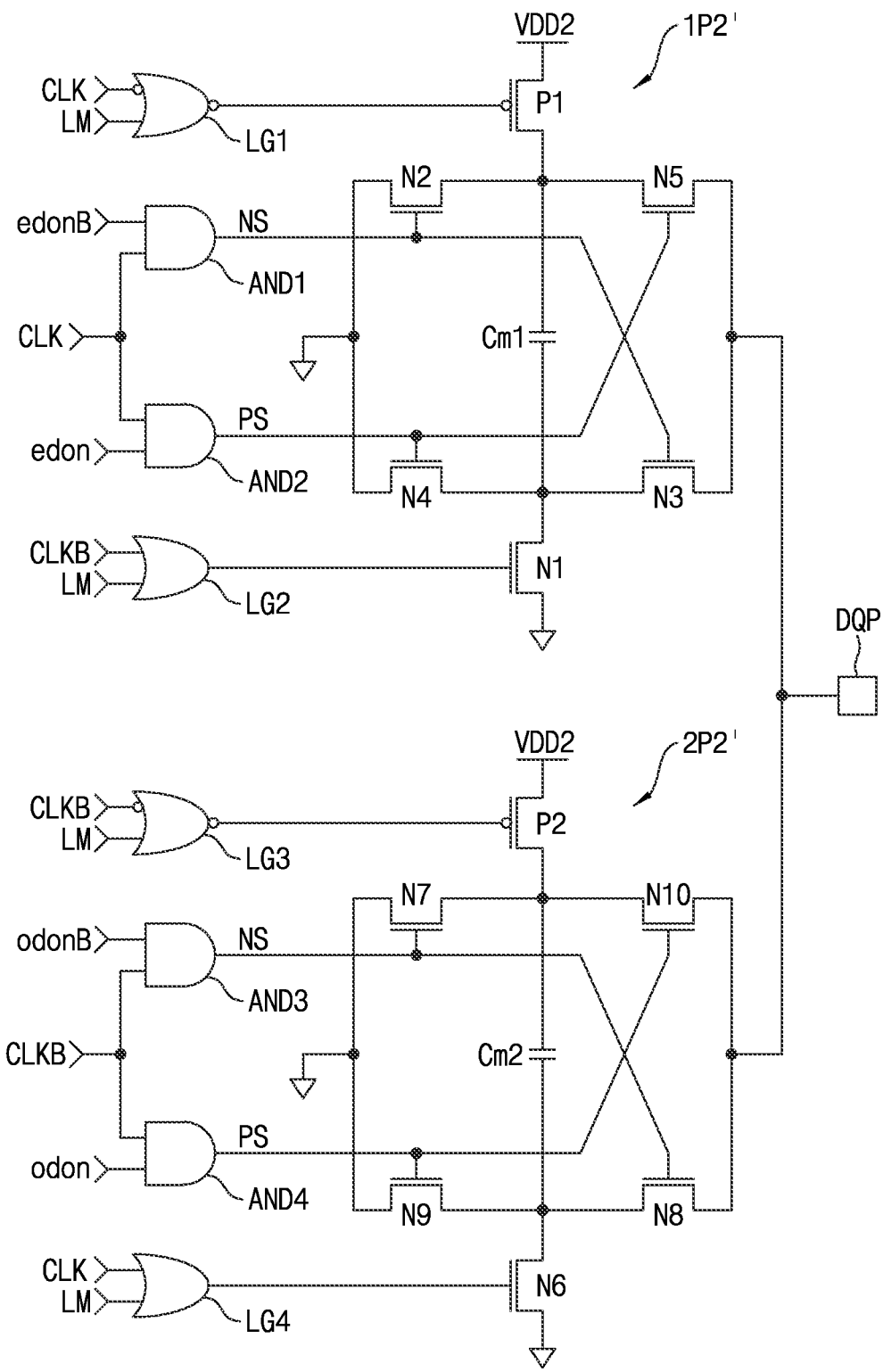
FIG. 12 is a circuit diagram illustrating configurations of a first main pump and a second main pump according to an embodiment of the inventive concept.

FIG. 12 is a circuit diagram illustrating configurations of a first main pump and a second main pump according to an embodiment of the inventive concept. The first main pump 1P2' may further include a first logic gate circuit LG1 and a second logic gate circuit LG2 as compared to the first main pump 1P2 shown in FIG. 6, and the second main pump 2P2' may further include a third logic gate circuit LG3 and a fourth logic gate circuit LG4 as compared to the second main pump 1P2 shown in FIG. 6.

In a high frequency mode operation, the first main pump 1P2' and the second main pump 2P2' shown in FIG. 12 may perform substantially the same operation as described above with reference to FIGS. 1 to 9. Further, the first main pump 1P2' and the second main pump 2P2' shown in FIG. 12 may further perform a low frequency mode operation in response to the low frequency mode signal LM generated in the low frequency mode operation.

The low frequency mode operation of the first main pump 1P2' and the second main pump 2P2' shown in FIG. 12 is described.

Each of the first logic gate circuit LG1 to the fourth logic gate circuit LG4 may generate a signal having a "high" level regardless of a level of the clock signal CLK when the low frequency mode signal LM has a "high" level. Accordingly, the first PMOS transistor P1, the second PMOS transistor P2, the first NMOS transistor N1, and the second NMOS transistor N2 may be always turned on.

When the clock signal CLK has a "low" level and the inverted clock signal CLKB has a "high" level, in the first main pump 1P2', both the first AND circuit AND1 and the second AND circuit AND2 may generate signals having a "low" level, and all of the second NMOS transistor N2 to the fifth NMOS transistor N5 may be turned off. In other words, the first main pump 1P2' may not perform a precharge operation. In this case, the third AND circuit AND3 of the second main pump 2P2' may generate the negative driving signal NS having a "high" level when inverted odd main data odonB has a "high" level, and the seventh NMOS transistor N7 and the eighth NMOS transistor N8 may be turned on in response to the negative driving signal NS having the "high" level. In the low frequency mode operation, the second driving capacitor Cm2 may be considered to be short-circuited, and thus a current path may be formed from the data terminal DQP to a ground voltage and a current may flow. Accordingly, the ground voltage may be generated at the data terminal DQP. On the other hand, in this case, the fourth AND circuit AND4 of the second main pump 2P2' may generate the positive driving signal PS having a "high" level when odd main data odon has a "high" level, the ninth NMOS transistor N9 and the tenth NMOS transistor N10 may be turned on in response to the positive driving signal PS having the "high" level. In the low frequency mode operation, the second driving capacitor Cm2 may be considered to be short-circuited, and thus a current path may be formed from the second driving supply voltage VDD2 to the data terminal DQP through the second PMOS transistor P2 and the tenth NMOS transistor N10 and a current may flow. Accordingly, a positive voltage may be generated at the data terminal DQP.

When the clock signal CLK has a "low" level and the inverted clock signal CLKB has a "high" level, in the second main pump 2P2', both the third AND circuit AND3 and the fourth AND circuit AND4 may generate signals having a "low" level, and all of the sixth NMOS transistor N6 to the tenth NMOS transistor N10 may be turned off. In other words, the second main pump 2P2' may not perform a precharge operation. In this case, in the first main pump 1P2', the first AND circuit AND1 may generate the negative driving signal NS having a "high" level when inverted even main data edonB has a "high" level, and the second NMOS transistor N2 and the third NMOS transistor N3 may be turned on in response to the negative driving signal NS having the "high" level. In the low frequency mode operation, the first driving capacitor Cm1 may be considered to be short-circuited, and thus a current path may be formed from the data terminal DQP to the ground voltage through the third NMOS transistor N3 and the first NMOS transistor N1 and a current may flow.

Accordingly, the ground voltage may be generated at the data terminal DQP. On the other hand, in the first main pump 1P2', the second AND circuit AND2 may generate a positive driving signal PS having a "high" level when even main data edon has a "high" level, and the fourth NMOS transistor N4 and the fifth NMOS transistor N5 may be turned on in response to the positive driving signal PS having the "high" level. In the low frequency mode operation, the first driving capacitor Cm1 may be considered to be short-circuited, and thus a current path may be formed from the second driving supply voltage VDD2 to the data terminal DQP through the first PMOS transistor P1 and the fifth NMOS transistor N5 and a current may flow. Accordingly, a positive voltage may be generated at the data terminal DQP.

Figure 13:
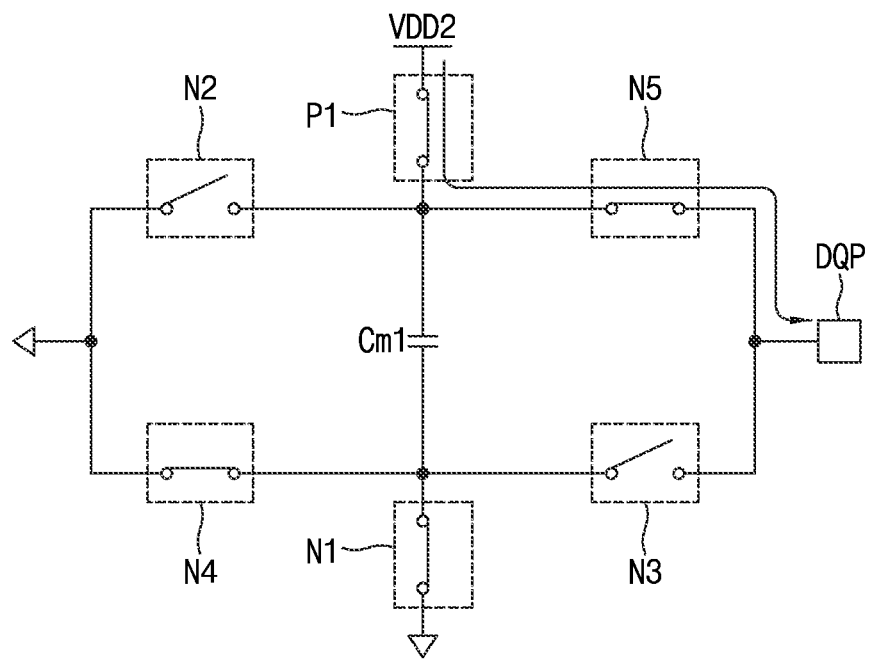
FIG. 13 is a conceptual diagram for describing a driving operation of a main pump of an output driver according to an embodiment of the inventive concept.

FIG. 13 is a conceptual diagram for describing a driving operation of a main pump of an output driver according to an embodiment of the inventive concept. In FIG. 13, the first PMOS transistor P1, the first NMOS transistor N1, the fourth NMOS transistor N4, and the fifth NMOS transistor N5 shown in FIG. 12 may be shown as switches having an on state, and the second NMOS transistor N2 and the third NMOS transistor N3 shown in FIG. 12 may be shown as switches having an off state.

Referring to FIG. 13, in a driving operation of the low frequency mode operation, a current path may be formed from the second driving supply voltage VDD2 to the data terminal DQP through the first PMOS transistor P1 and the fifth NMOS transistor N5, and thus a positive voltage may be generated at the data terminal DQP.

Figure 14:
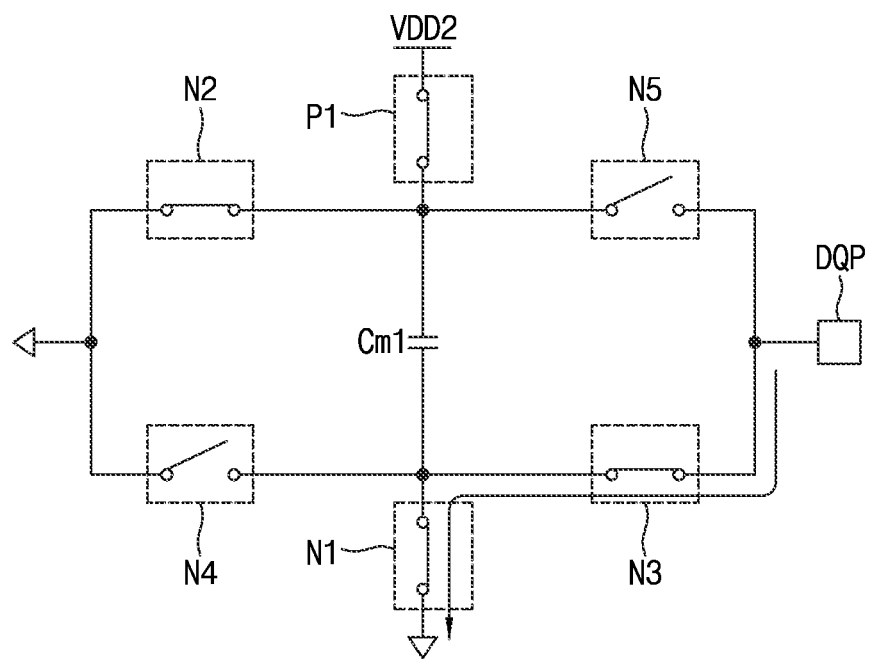
FIG. 14 is a conceptual diagram for describing a driving operation of a main pump of an output driver according to an embodiment of the inventive concept.

FIG. 14 is a conceptual diagram for describing a driving operation of a main pump of an output driver according to an embodiment of the inventive concept. In FIG. 14, the first PMOS transistor P1, the first NMOS transistor N1, the second NMOS transistor N2, and the third NMOS transistor N3 shown in FIG. 12 may be shown as switches having an on state, and the fourth NMOS transistor N4 and the fifth NMOS transistor N5 shown in FIG. 12 may be shown as switches having an off state.

Referring to FIG. 14, in a driving operation of the low frequency mode operation, a current path may be formed from the data terminal DQP to the ground voltage through the third NMOS transistor N3 and the first NMOS transistor N1, and thus the ground voltage may be generated at the data terminal DQP.

Referring to FIGS. 8, 9, 13, and 14, a (first) driving operation in the high frequency mode operation and a (second) driving operation in the low frequency mode operation may be different from each other.

Figure 15A:
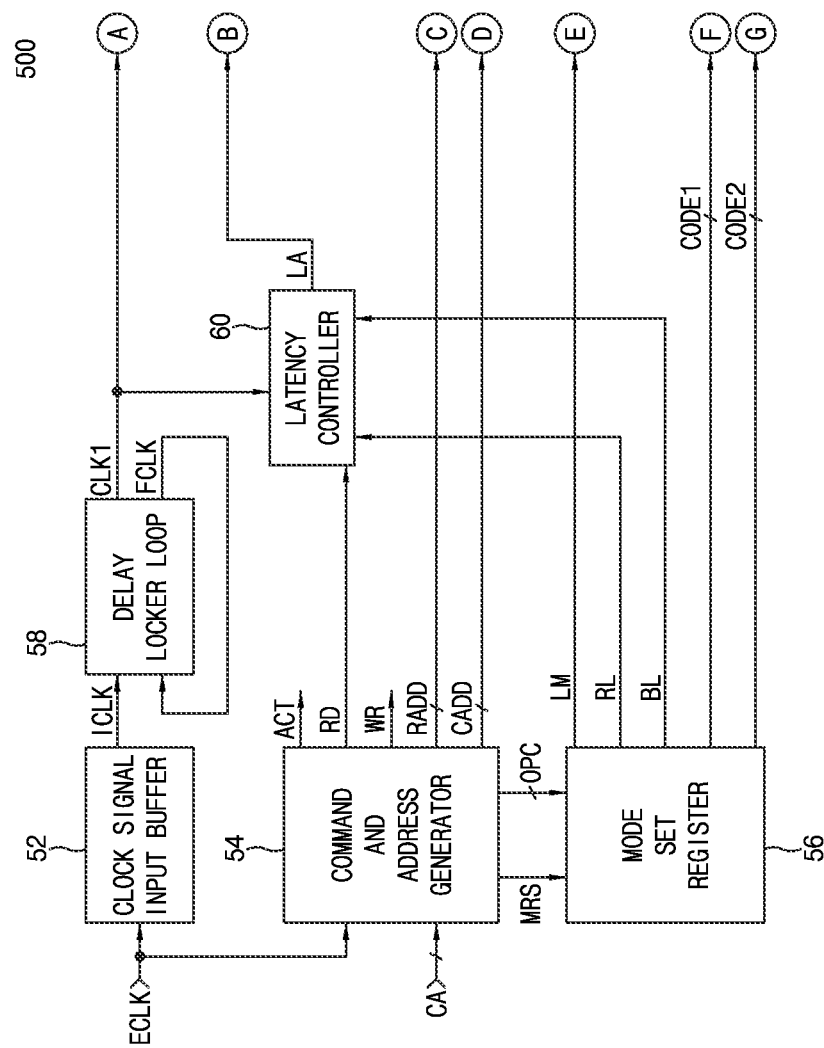
FIGS. 15A and 15B are block diagrams illustrating a configuration of a semiconductor memory device according to an embodiment of the inventive concept.
Figure 15B:
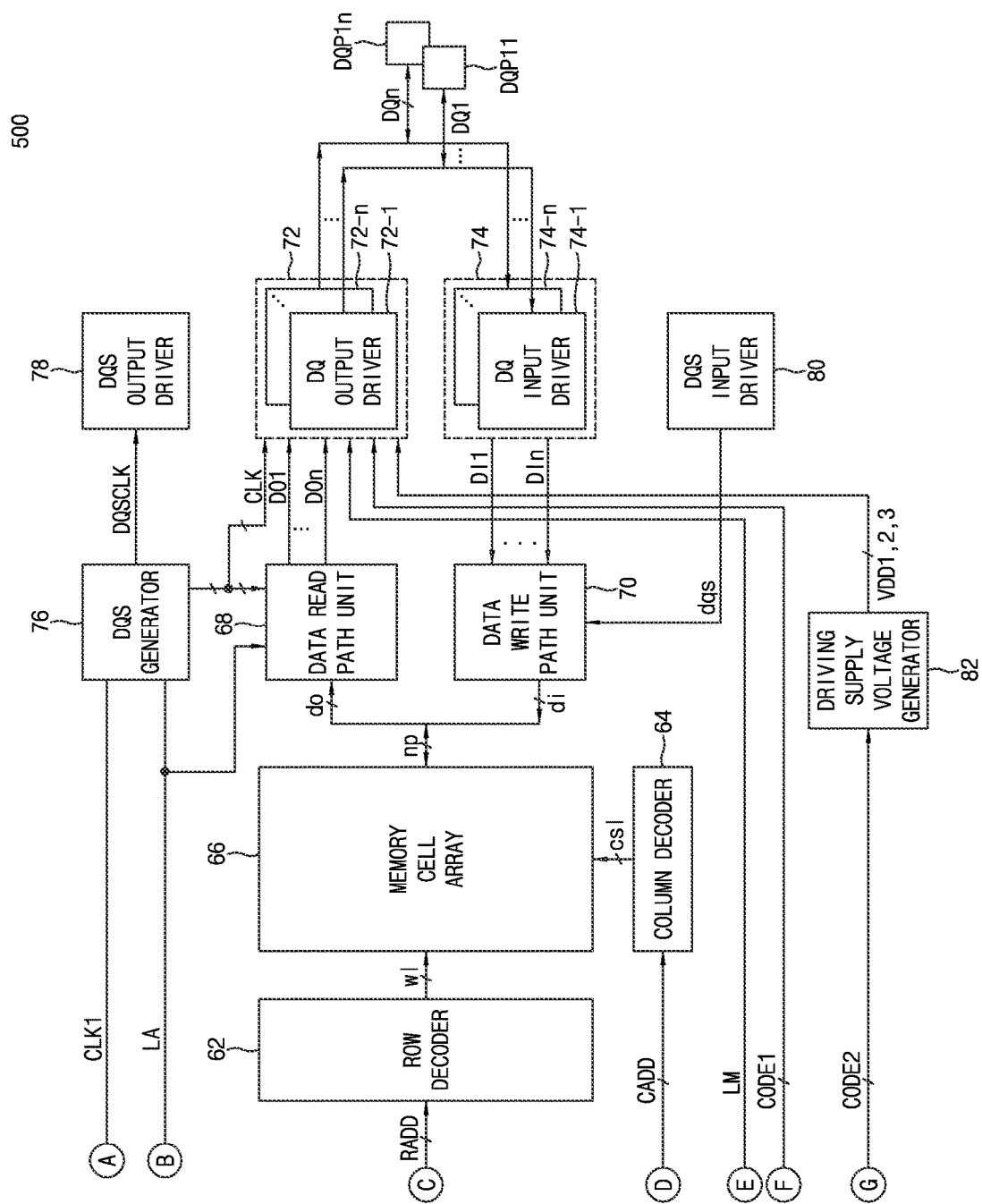

FIGS. 15A and 15B are block diagrams illustrating a configuration of a semiconductor memory device according to an embodiment of the inventive concept. A semiconductor memory device 500 may include a clock signal input buffer 52, a command and address generator 54, a mode set register 56, a delay locked loop 58, a latency controller 60, a row decoder 62, a column decoder 64, a memory cell array 66, a data read path unit 68, a data write path unit 70, a data DQ output driver 72, a DQ input driver 74, a data strobe signal DQS generator 76, a DQS output driver 78, a DQS input driver 80, and a driving supply voltage generator 82.

Functions of the blocks shown in FIGS. 15A and 15B are described below.

The clock signal input buffer 52 may buffer an external clock signal ECLK to generate an input clock signal ICLK.

The command and address generator 54 may decode a command and address CA to generate a mode set command MRS, an active command ACT, a read command RD, and a write command WR, in response to the external clock signal ECLK. Further, the command and address generator 54 may generate an address signal included in the command and address CA as a mode set code OPC in response to the mode set command MRS, generate the address signal included in the command and address CA as a row address RADD in response to the active command ACT, and generate the address signal included in the command and address CA as a column address CADD in response to the read command RD or the write command WR.

The mode set register 56 may store the mode set code OPC to set a read latency RL, a burst length BL, the low frequency mode signal LM, a first code CODE1, and a second code CODE2, in response to the mode set command MRS.

The delay locked loop 58 may generate a feedback clock signal FCLK locked to the input clock signal ICLK, and delay the input clock signal ICLK to generate a first clock signal CLK1.

The latency controller 60 may generate a latency signal LA which is activated after delaying by a number of clock cycles corresponding to a value of the read latency RL and is deactivated after delaying by a number of clock cycles corresponding to the value of the read latency RL+a number of clock cycles corresponding to a value of the burst length BL, using the first clock signal CLK1 when the read command RD is applied.

The row decoder 62 may decode the row address RADD to generate a plurality of word line selection signals wl.

The column decoder 64 may decode the column address CADD to generate a plurality of column selection signal lines csl.

The memory cell array 66 may include a plurality of memory cells connected between a plurality of word lines selected by the plurality of word line selection signal lines wl and a plurality of bit lines selected by the plurality of column selection signal lines csl. The memory cell array 66 may output read data do from memory cells selected by the plurality of word line selection signals wl and the plurality of column selection signals csl in response to the read command RD, and store write data di in the memory cells selected by the plurality of word line selection signals wl and the plurality of column selection signals csl in response to the write command WR. For example, the memory cell array 66 may output np-bit read data do, or store np-bit write data di.

The data read path unit 68 may receive the read data do output from the memory cell array 66, and output output data DO in response to the internal clock signal CLK during an activation period of the latency signal LA. For example, the data read path unit 68 may receive the np-bit read data do, and sequentially generate each of n output data DO (DO1 to Don) in series by the number p corresponding to the burst length BL.

The data write path unit 70 may receive data DI in response to an input data strobe signal dqs, and output data to the memory cell array 66. The data write path unit 70 may sequentially receive each of n input data DI (DI1 to DIn) in series by the number p corresponding to the burst length BL, and output np-bit write data di.

The DQ output driver 72 may include n output drivers 72-1 to 72-n connected to n data output terminals DQP11 to DQP1n, and drive the output data DO to generate data DQ. Each of the n output drivers 72-1 to 72-n may be the output driver 10 or 10' described above with reference to FIGS. 1 to 14. In the DQ output driver 72, the number of the pre driving units, the number of the main driving units, and the number of the post driving units that are activated may be determined in response to the first code CODE1. Further, the first driving supply voltage VDD1, the second driving supply voltage VDD2, and the third driving supply voltage VDD3, which are set in response to the second code CODE2, may be supplied by the driving supply voltage generator 82.

The DQ input driver 74 may include n input drivers 74-1 to 74-n connected to the n data terminals DQP11 to DQP1n, and drive data DQ received from the outside to generate n input data DI1 to DIn.

The DQS generator 76 may be connected to a data strobe signal terminal DQSP, and generate a DQS clock signal DQSCLK using the first clock signal CLK1 in response to the latency signal LA. The DQS generator 76 may generate an internal clock signal CLK0 having a 0 degree phase difference with the first clock signal CLK1, an internal clock signal CLK90 having a 90-degree phase difference with the first clock signal CLK1, an internal clock signal CLK180 having a 180-degree phase difference with the first clock signal CLK1, and an internal clock signal CLK270 having a 270-degree phase difference with the first clock signal CLK1, using the first clock signal CLK1.

The DQS output driver 78 may be connected to the DQS terminal DQSP, and buffer the DQS clock signal DQSCLK to generate the data strobe signal DQS having the same frequency and phase as the external clock signal ECLK.

The DQS input driver 80 may be connected to the DQS terminal DQSP, and drive the data strobe signal DQS received from the outside to generate the input data strobe signal dqs.

The driving supply voltage generator 82 may set levels of the first driving supply voltage VDD1, the second driving supply voltage VDD2, and the third driving supply voltage VDD3 in response to the second code CODE2.

As described above, according to embodiments of the inventive concept, the output driver drives data by removing the pre-cursor interference and the post-cursor interference. Further, the output driver stably drives data in a low frequency mode operation. Accordingly, a semiconductor memory device having the output driver can have improved operation reliability.

While the inventive concept has been particularly shown and described with reference to embodiments thereof, it will be apparent to those of ordinary skill in the art that various changes in form and details may be made thereto without departing from the spirit and scope of the inventive concept as set forth by the appended claims.

What is claimed is:
1. An output driver comprising:
a pre driver connected between a first driving supply voltage and a ground voltage, and including a first predetermined number of pre driving circuits, each including a first pre pump and a second pre pump commonly connected to a data terminal; and
a main driver connected between a second driving supply voltage and the ground voltage, and including a second predetermined number of main driving circuits, each including a first main pump and a second main pump commonly connected to the data terminal,
wherein each of the first pre pump and the second pre pump includes a first driving capacitor, and each of the first main pump and the second main pump includes a second driving capacitor,
wherein, in a first frequency mode operation, during a first half cycle of a clock signal, the first pre pump performs a precharge operation on the first driving capacitor, the first main pump performs the precharge operation on the second driving capacitor, the second pre pump performs a first driving operation on the first driving capacitor in response to inverted even pre data, and the second main pump performs the first driving operation on the second driving capacitor in response to odd data, and during a second half cycle of the clock signal, the first pre pump performs the first driving operation on the first driving capacitor in response to inverted odd pre data, the first main pump performs the first driving operation on the second driving capacitor in response to even data, the second pre pump performs the precharge operation on the first driving capacitor, and the second main pump performs the precharge operation on the second driving capacitor, and
wherein a capacitance of the first driving capacitor and a capacitance of the second driving capacitor are different from each other.

2. The output driver of claim 1, wherein the output driver further comprises:
a post driver connected between a third driving supply voltage and the ground voltage, and including a third predetermined number of post driving circuits, each including a first post pump and a second post pump commonly connected to the data terminal,
wherein each of the first post pump and the second post pump includes a third driving capacitor,
wherein, during the first half cycle of the clock signal, the first post pump performs the precharge operation on the third driving capacitor, and the second post pump performs the first driving operation on the third driving capacitor in response to inverted even post data, and during the second half cycle of the clock signal, the first post pump performs the first driving operation on the third driving capacitor in response to inverted even post data, and the second post pump performs the precharge operation on the third driving capacitor,
wherein the capacitance of the first driving capacitor, the capacitance of the second driving capacitor, and a capacitance of the third driving capacitor are different from one another.

3. The output driver of claim 2, wherein the first driving supply voltage, the second driving supply voltage, and the third driving supply voltage are different from one another.

4. The output driver of claim 3, wherein a first driving capability is coarsely tuned according to a number of the pre driving circuits that are activated among the first predetermined number of the pre driving circuits, a second driving capability is coarsely tuned according to a number of the main driving circuits that are activated among the second predetermined number of the main driving circuits, and a third driving capability is coarsely tuned according to a number of the post driving circuits that are activated among the third predetermined number of the post driving circuits, and wherein the first driving capability is finely tuned by adjusting the first driving supply voltage, the second driving capability is finely tuned by adjusting the second driving supply voltage, and the third driving capability is finely tuned by adjusting the third driving supply voltage.

5. The output driver of claim 2, wherein, in a second frequency mode operation, the first pre pump, the second pre pump, the first post pump, and the second post pump do not perform the precharge operation and a second driving operation, and during the first half cycle of the clock signal, the first main pump does not perform the precharge operation and the second main pump performs the second driving operation in response to the odd data, and during the second cycle of the clock signal, the first main pump performs the second driving operation in response to the even data, and the second main pump does not perform the precharge operation.

6. The output driver of claim 5, wherein each of the first pre pump, the first main pump, and the first post pump further comprises:

a first switch connected between the first driving supply voltage, the second driving supply voltage, or the third driving supply voltage and a first node, and configured to be turned on in response to a first state of the clock signal;

a second switch connected between a second node and the ground voltage, and configured to be turned on in response to a second state of an inverted clock signal;

a first AND circuit configured to generate a first negative driving signal in response to the first state of the clock signal, and odd pre data, inverted even main data, or odd post data, and generate a first positive driving signal in response to the first state of the clock signal, and the inverted odd pre data, the even main data, or the inverted odd post data;

a third switch connected between the ground voltage and the first node, and configured to be turned on in response to the first negative driving signal;

a fourth switch connected between the second node and the data terminal, and configured to be turned on in response to the first negative driving signal;

a fifth switch connected between the ground voltage and the second node, and configured to be turned on in response to the first positive driving signal; and a sixth switch connected between the first node and the data terminal, and configured to be turned on in response to the first positive driving signal, wherein each of the first driving capacitor, the second driving capacitor, and the third driving capacitor of the first pre pump, the first main pump, and the first post pump, respectively, is connected between the first node and the second node, wherein each of the second pre pump, the second main pump, and the second post pump further comprises:

a seventh switch connected between the first driving supply voltage, the second driving supply voltage, or the third driving supply voltage and a third node, and configured to be turned on in response to a first state of the inverted clock signal;

an eighth switch connected between a fourth node and the ground voltage, and configured to be turned on in response to a second state of the clock signal;

a second AND circuit configured to generate a second negative driving signal in response to the second state of the inverted clock signal, and even pre data, inverted odd main data, or even post data, and generate a second positive driving signal in response to the second state of the inverted clock signal, and the inverted even pre data, odd main data, or the inverted even post data;

a ninth switch connected between the ground voltage and the third node, and configured to be turned on in response to the second negative driving signal;

a tenth switch connected between the fourth node and the data terminal, and configured to be turned on in response to the second negative driving signal;

an eleventh switch connected between the ground voltage and the fourth node, and configured to be turned on in response to the second positive driving signal; and a twelfth switch connected between the third node and the data terminal, and configured to be turned on in response to the second positive driving signal, and wherein each of the first driving capacitor, the second driving capacitor, and the third driving capacitor of the second pre pump, the second main pump, and the second post pump, respectively, is connected between the third node and the fourth node.

7. The output driver of claim 6, wherein each of the first switch and the seventh switch is a PMOS transistor, each of the second switch to the sixth switch is an NMOS transistor, and each of the eighth switch to the twelfth switch is an NMOS transistor.

8. The output driver of claim 6, wherein, in the second frequency mode operation, the first switch, the second switch, the seventh switch, and the eighth switch are turned on regardless of a state of the clock signal.

9. An output driver comprising:

a main driver connected between a first driving supply voltage and a ground voltage, and including a first predetermined number of main driving circuits, each including a first main pump and a second main pump commonly connected to a data terminal; and a post driver connected between a second driving supply voltage and the ground voltage, and including a second predetermined number of post driving circuits, each including a first post pump and a second post pump commonly connected to the data terminal, wherein each of the first main pump and the second main pump includes a first driving capacitor, and each of the first post pump and the second post pump includes a second driving capacitor, wherein, in a first frequency mode operation, during a first half cycle of a clock signal, the first main pump performs a precharge operation on the first driving capacitor, the first post pump performs the precharge operation on the second driving capacitor, the second main pump performs a first driving operation on the first driving capacitor in response to odd data, and the second post pump performs the first driving operation on the second driving capacitor in response to inverted even post data, and during a second half cycle of the clock signal, the first main pump performs the first driving operation on the first driving capacitor in response to even data, the first post pump performs the first driving operation on the second driving capacitor in response to inverted even post data, the second main pump performs the precharge operation on the first driving capacitor, and the second post pump performs the precharge operation on the second driving capacitor, and wherein a capacitance of the first driving capacitor and a capacitance of the second driving capacitor are different from each other.

10. The output driver of claim 9, wherein the first driving supply voltage and the second driving supply voltage are different from each other.

11. The output driver of claim 10, wherein a first driving capability is coarsely tuned according to a number of the main driving circuits that are activated among the first predetermined number of the main driving circuits, and a second driving capability is coarsely tuned according to a number of the post driving circuits that are activated among the second predetermined number of the post driving circuits, and wherein the first driving capability is finely tuned by adjusting the first driving supply voltage, and the second driving capability is finely tuned by adjusting the second driving supply voltage.

12. The output driver of claim 9, wherein, in a second frequency mode operation, the first post pump and the second post pump do not perform the precharge operation and a second driving operation, and during the first half cycle of the clock signal, the first main pump does not perform the precharge operation and the second main pump performs the second driving operation in response to the odd data, and during the second half cycle of the clock signal, the first main pump performs the second driving operation in response to the even data, and the second main pump does not perform the precharge operation.

13. The output driver of claim 12, wherein each of the first main pump and the first post pump comprises:

a first switch connected between the first driving supply voltage or the second driving supply voltage and a first node, and configured to be turned on in response to a first state of the clock signal;

a second switch connected between a second node and the ground voltage, and configured to be turned on in response to a second state of an inverted clock signal;

a first AND circuit configured to generate a first negative driving signal in response to the first state of the clock signal, and inverted even main data or odd post data, and generate a first positive driving signal in response to the first state of the clock signal, and the even main data or the inverted odd post data;

a third switch connected between the ground voltage and the first node, and configured to be turned on in response to the first negative driving signal;

a fourth switch connected between the second node and the data terminal, and configured to be turned on in response to the first negative driving signal;

a fifth switch connected between the ground voltage and the second node, and configured to be turned on in response to the first positive driving signal; and a sixth switch connected between the first node and the data terminal, and configured to be turned on in response to the first positive driving signal, wherein each of the first driving capacitor and the second driving capacitor of the first main pump and the first post pump, respectively, is connected between the first node and the second node, wherein each of the second main pump and the second post pump comprises:

a seventh switch connected between the first driving supply voltage or the second driving supply voltage, and a third node, and configured to be turned on in response to a first state of the inverted clock signal;

an eighth switch connected between a fourth node and the ground voltage, and configured to be turned on in response to a second state of the clock signal;

a second AND circuit configured to generate a second negative driving signal in response to the second state of the inverted clock signal, and inverted odd main data or even post data, and generate a second positive driving signal in response to the second state of the inverted clock signal, and odd main data or the inverted even post data;

a ninth switch connected between the ground voltage and the third node, and configured to be turned on in response to the second negative driving signal;

a tenth switch connected between the fourth node and the data terminal, and configured to be turned on in response to the second negative driving signal;

an eleventh switch connected between the ground voltage and the fourth node, and configured to be turned on in response to the second positive driving signal; and a twelfth switch connected between the third node and the data terminal, and configured to be turned on in response to the second positive driving signal, and wherein each of the first driving capacitor and the second driving capacitor of the second main pump and the second post pump, respectively, is connected between the third node and the fourth node.

14. The output driver of claim 13, wherein, in the second frequency mode operation, the first switch, the second switch, the seventh switch, and the eighth switch are turned on regardless of a state of the clock signal.

15. A semiconductor memory device comprising:

a row decoder configured to generate a plurality of word line selection signals in response to a row address;

a column decoder configured to generate a plurality of column selection signals in response to a column address;

a memory cell array including a plurality of memory cells, and configured to output data, stored in memory cells selected by the plurality of word line selection signals and the plurality of column selection signals, as read data;

a data read path circuit configured to receive the read data to generate data;

output drivers configured to drive the data to generate output data; and data terminals connected to the output drivers, respectively, wherein each of the output drivers comprises a pre driver connected between a first driving supply voltage and a ground voltage, and including a first predetermined number of pre driving circuits, each including a first pre pump and a second pre pump commonly connected to the data terminal, and a main driver connected between a second driving supply voltage and the ground voltage, and including a second predetermined number of main driving circuits, each including a first main pump and a second main pump commonly connected to the data terminal, wherein each of the first pre pump and the second pre pump includes a first driving capacitor, and each of the first main pump and the second main pump includes a second driving capacitor, wherein, in a first frequency mode operation, during a first half cycle of a clock signal, the first pre pump performs a precharge operation on the first driving capacitor, the first main pump performs the precharge operation on the second driving capacitor, the second pre pump performs a first driving operation on the first driving capacitor in response to inverted even pre data, and the second main pump performs the first driving operation on the second driving capacitor in response to odd data, and during a second half cycle of the clock signal, the first pre pump performs the first driving operation on the first driving capacitor in response to inverted odd pre data, the first main pump performs the first driving operation on the second driving capacitor in response to even data, the second pre pump performs the precharge operation on the first driving capacitor, and the second main pump performs the precharge operation on the second driving capacitor, and wherein a capacitance of the first driving capacitor and a capacitance of the second driving capacitor are different from each other.

16. The semiconductor memory device of claim 15, wherein the output driver further comprises:
a post driver connected between a third driving supply voltage and the ground voltage, and including a third predetermined number of post driving circuits, each including a first post pump and a second post pump commonly connected to the data terminal,
wherein each of the first post pump and the second post pump includes a third driving capacitor,
wherein, during the first half cycle of the clock signal, the first post pump performs the precharge operation on the third driving capacitor, and the second post pump performs the first driving operation on the third driving capacitor in response to inverted even post data, and during the second half cycle of the clock signal, the first post pump performs the first driving operation on the third driving capacitor in response to inverted even post data, and the second post pump performs the precharge operation on the third driving capacitor,
wherein the capacitance of the first driving capacitor, the capacitance of the second driving capacitor, and a capacitance of the third driving capacitor are different from one another.

17. The semiconductor memory device of claim 16, wherein the first driving supply voltage, the second driving supply voltage, and the third driving supply voltage are different from one another, and
wherein a first driving capability is coarsely tuned according to a number of the pre driving circuits that are activated among the first predetermined number of the pre driving circuits, a second driving capability is coarsely tuned according to a number of the main driving circuits that are activated among the second predetermined number of the main driving circuits, and a third driving capability is coarsely tuned according to a number of the post driving circuits that are activated among the third predetermined number of the post driving circuits, and
wherein the first driving capability is finely tuned by adjusting the first driving supply voltage, the second driving capability is finely tuned by adjusting the second driving supply voltage, and the third driving capability is finely tuned by adjusting the third driving supply voltage.

18. The semiconductor memory device of claim 16, wherein, in a second frequency mode operation, the first pre pump, the second pre pump, the first post pump, and the second post pump do not perform the precharge operation and a second driving operation, and during the first half cycle of the clock signal, the first main pump does not perform the precharge operation and the second main pump performs the second driving operation in response to the odd data, and during the second half cycle of the clock signal, the first main pump performs the second driving operation in response to the even data, and the second main pump does not perform the precharge operation.

19. The semiconductor memory device of claim 18, wherein each of the first pre pump, the first main pump, and the first post pump further comprises:
a first switch connected between the first driving supply voltage, the second driving supply voltage, or the third driving supply voltage and a first node, and configured to be turned on in response to a first state of the clock signal;
a second switch connected between a second node and the ground voltage, and configured to be turned on in response to a second state of an inverted clock signal;
a first AND circuit configured to a first negative driving signal in response to the first state of the clock signal, and odd pre data, inverted even main data, or odd post data, and generate a first positive driving signal in response to the first state of the clock signal, and the inverted odd pre data, the even main data, or the inverted odd post data;
a third switch connected between the ground voltage and the first node, and configured to be turned on in response to the first negative driving signal;
a fourth switch connected between the second node and the data terminal, and configured to be turned on in response to the first negative driving signal;
a fifth switch connected between the ground voltage and the second node, and configured to be turned on in response to the first positive driving signal; and
a sixth switch connected between the first node and the data terminal, and configured to be turned on in response to the first positive driving signal,
wherein each of the first driving capacitor, the second driving capacitor, and the third driving capacitor of the first pre pump, the first main pump, and the first post pump, respectively, is connected between the first node and the second node,
wherein each of the second pre pump, the second main pump, and the second post pump further comprises:
a seventh switch connected between the first driving supply voltage, the second driving supply voltage, or the third driving supply voltage and a third node, and configured to be turned on in response to a first state of the inverted clock signal;
an eighth switch connected between a fourth node and the ground voltage, and configured to be turned on in response to a second state of the clock signal;
a second AND circuit configured to generate a second negative driving signal in response to the second state of the inverted clock signal, and even pre data, inverted odd main data, or even post data, and generate a second positive driving signal in response to the second state of the inverted clock signal, and the inverted even pre data, odd main data, or the inverted even post data;
a ninth switch connected between the ground voltage and the third node, and configured to be turned on in response to the second negative driving signal;
a tenth switch connected between the fourth node and the data terminal, and configured to be turned on in response to the second negative driving signal;

an eleventh switch connected between the ground voltage and the fourth node, and configured to be turned on in response to the second positive driving signal; and a twelfth switch connected between the third node and the data terminal, and configured to be turned on in response to the second positive driving signal, and wherein each of the first driving capacitor, the second driving capacitor, and the third driving capacitor of the second pre pump, the second main pump, and the second post pump, respectively, is connected between the third node and the fourth node.

20. The semiconductor memory device of claim 19, wherein the semiconductor memory device further comprises:

a command and address generator configured to decode a command and address applied from the outside to generate a mode set command, an active command, a read command, and a write command, generate an address signal included in the command and address as a mode set code in response to the mode set command, generate the address signal included in the command and address as the row address in response to the active command, and generate the address signal included in the command and address as the column address in response to the read command or the write command; and a mode set register configured to store the mode set code in response to the mode set command to set a low frequency mode signal, a first code, and a second code, wherein the first switch, the second switch, the seventh switch, and the eighth switch are turned on regardless of a state of the clock signal in response to the low frequency mode signal, wherein a number of the pre driving circuits that are activated among the first predetermined number of the pre driving circuits, a number of the main driving circuits that are activated among the second predetermined number of the main driving circuits, and a number of the post driving circuits that are activated among the third predetermined number of the post driving circuits, are determined in response to the first code, and wherein levels of the first driving supply voltage, the second driving supply voltage, and the third driving supply voltage are set in response to the second code.

\* \* \* \* \*